US010401411B2

(12) United States Patent
Snook et al.

(10) Patent No.: US 10,401,411 B2
(45) Date of Patent: Sep. 3, 2019

(54) MAINTAINING SETS OF CABLE COMPONENTS USED FOR WIRED ANALYSIS, CHARGING, OR OTHER INTERACTION WITH PORTABLE ELECTRONIC DEVICES

(71) Applicant: ecoATM, LLC, San Diego, CA (US)

(72) Inventors: James Andrew Snook, San Diego, CA (US); Rick Segil, San Diego, CA (US)

(73) Assignee: ecoATM, LLC, San Diego, CA (US)

( * ) Notice: Subject to any disclaimer, the term of this patent is extended or adjusted under 35 U.S.C. 154(b) by 1052 days.

(21) Appl. No.: 14/500,739

(22) Filed: Sep. 29, 2014

(65) Prior Publication Data

US 2016/0091549 A1    Mar. 31, 2016

(51) Int. Cl.
*G01R 31/02* (2006.01)
*G01R 31/08* (2006.01)
*G01R 31/28* (2006.01)

(52) U.S. Cl.
CPC ........... *G01R 31/021* (2013.01); *G01R 31/08* (2013.01); *G01R 31/2844* (2013.01)

(58) Field of Classification Search
CPC ... G01R 31/021; G01R 31/2844; G01R 31/08
USPC ....... 324/500, 543, 664, 694, 658, 548, 678, 324/686, 765, 768, 600, 76.11, 522, 539, 324/754.26, 713, 84, 403, 412, 200, 222; 705/2, 51, 16, 14.37, 1.1, 308; 235/381, 235/382
See application file for complete search history.

(56) References Cited

U.S. PATENT DOCUMENTS

| 3,808,439 A | 4/1974 | Renius |
| 4,248,334 A | 2/1981 | Hanley et al. |
| 4,519,522 A | 5/1985 | McElwee |

(Continued)

FOREIGN PATENT DOCUMENTS

| CN | 1365479 A1 | 8/2002 |
| CN | 2708415 A1 | 7/2005 |

(Continued)

OTHER PUBLICATIONS

2006 Florida Statutes Title XXXIII, Chapter 538, Sections 538.03 and 538.04, 7 pages.

(Continued)

*Primary Examiner* — Melissa J Koval
*Assistant Examiner* — Trung Nguyen
(74) *Attorney, Agent, or Firm* — Perkins Coie LLP

(57) ABSTRACT

A machine for processing electronic devices in accordance with a particular embodiment of the present technology includes a cable system at least partially disposed within a housing. The cable system can include a hub, a plurality of cable components detachably coupled to the hub, and a drive mechanism operably connected to the plurality of cable components. The drive mechanism can be configured to cause a given one of the plurality of cable components to be staged for testing. The cable system can further include a controller and a test port. The controller can include memory, processing circuitry, and testing circuitry. The memory can store instructions that, when executed by the controller using the processing circuitry, cause the testing circuitry to test the staged cable component while the staged cable component is detachably coupled to the test port.

29 Claims, 11 Drawing Sheets

(56) References Cited

U.S. PATENT DOCUMENTS

| | | | |
|---|---|---|---|
| 4,715,709 A | 12/1987 | Sekine et al. | |
| 4,821,118 A | 4/1989 | Lafreniere | |
| 4,870,357 A | 9/1989 | Young et al. | |
| 4,878,736 A | 11/1989 | Hekker et al. | |
| 4,927,051 A | 5/1990 | Falk et al. | |
| 4,951,308 A | 8/1990 | Bishop et al. | |
| 5,027,074 A | 6/1991 | Haferstat | |
| 5,077,462 A | 12/1991 | Newell et al. | |
| 5,091,773 A | 2/1992 | Fouche et al. | |
| 5,105,149 A | 4/1992 | Tokura | |
| 5,216,502 A | 6/1993 | Katz | |
| 5,280,170 A | 1/1994 | Baldwin | |
| 5,319,459 A | 6/1994 | Mochizuki et al. | |
| 5,339,096 A | 8/1994 | Beaufort et al. | |
| 5,419,438 A | 5/1995 | Squyres et al. | |
| 5,436,554 A | 7/1995 | Decker | |
| 5,570,920 A | 11/1996 | Crisman et al. | |
| 5,572,444 A | 11/1996 | Lentz et al. | |
| 5,610,710 A | 3/1997 | Canfield et al. | |
| 5,717,780 A | 2/1998 | Mitsumune et al. | |
| 5,747,784 A | 5/1998 | Walter et al. | |
| 5,775,806 A | 7/1998 | Allred | |
| 5,839,058 A | 11/1998 | Phillips et al. | |
| 5,920,338 A | 7/1999 | Katz | |
| 5,949,901 A | 9/1999 | Nichani et al. | |
| 5,965,858 A | 10/1999 | Suzuki et al. | |
| 5,966,654 A | 10/1999 | Croughwell et al. | |
| 5,987,159 A | 11/1999 | Nichani | |
| 5,988,431 A | 11/1999 | Roe | |
| 6,029,851 A | 2/2000 | Jenkins et al. | |
| 6,041,229 A | 3/2000 | Turner | |
| 6,181,805 B1 | 1/2001 | Koike et al. | |
| 6,228,008 B1 | 5/2001 | Pollington et al. | |
| 6,259,827 B1 | 7/2001 | Nichani | |
| 6,264,104 B1 | 7/2001 | Jenkins et al. | |
| 6,330,354 B1 | 12/2001 | Companion et al. | |
| 6,330,958 B1 | 12/2001 | Ruskin et al. | |
| 6,393,095 B1 | 5/2002 | Robinson | |
| 6,462,644 B1 | 10/2002 | Howell et al. | |
| 6,529,837 B1 | 3/2003 | Kang | |
| 6,535,637 B1 | 3/2003 | Wootton et al. | |
| 6,573,886 B1 | 6/2003 | Lehtinen et al. | |
| 6,587,581 B1 | 7/2003 | Matsuyama et al. | |
| 6,595,684 B1 | 7/2003 | Casagrande et al. | |
| 6,633,377 B1 | 10/2003 | Weiss et al. | |
| 6,667,800 B1 | 12/2003 | Larsson et al. | |
| 6,754,637 B1 | 6/2004 | Stenz | |
| 6,758,370 B2 | 7/2004 | Cooke et al. | |
| 6,798,528 B1 | 9/2004 | Hartman | |
| 6,822,422 B2 | 11/2004 | Sagawa | |
| 6,842,596 B2 | 1/2005 | Morii et al. | |
| 6,854,656 B2 | 2/2005 | Matsumori | |
| 7,069,236 B1 | 6/2006 | Tsunenari | |
| 7,076,449 B2 | 7/2006 | Tsunenari et al. | |
| 7,178,720 B1 | 2/2007 | Strubbe et al. | |
| 7,234,609 B2 | 6/2007 | DeLazzer et al. | |
| 7,251,458 B2 | 7/2007 | O'Connell | |
| 7,268,345 B2 | 9/2007 | Schultz | |
| 7,334,729 B2 | 2/2008 | Brewington | |
| 7,520,666 B2 | 4/2009 | Pevzner et al. | |
| 7,529,687 B1 | 5/2009 | Phan | |
| 7,567,344 B2 | 7/2009 | LeBlanc et al. | |
| 7,646,193 B2 | 1/2010 | Suzuki et al. | |
| 7,649,450 B2 | 1/2010 | Campion et al. | |
| 7,702,108 B2 | 4/2010 | Amon et al. | |
| 7,735,125 B1 | 6/2010 | Alvarez et al. | |
| 7,761,331 B2 | 7/2010 | Low et al. | |
| 7,783,379 B2 | 8/2010 | Beane et al. | |
| 7,881,965 B2 * | 2/2011 | Bowles | G06Q 10/30 705/1.1 |
| 8,010,402 B1 | 8/2011 | Sharma et al. | |
| 8,019,588 B1 | 9/2011 | Wohlberg et al. | |
| 8,025,229 B2 | 9/2011 | Hammond et al. | |
| 8,031,930 B2 | 10/2011 | Wang et al. | |
| 8,107,243 B2 * | 1/2012 | Guccione | G06F 1/26 330/285 |
| 8,112,325 B2 | 2/2012 | Foy et al. | |
| 8,195,511 B2 | 6/2012 | Bowles et al. | |
| 8,200,533 B2 | 6/2012 | Librizzi et al. | |
| 8,254,883 B2 | 8/2012 | Uchida | |
| 8,266,008 B1 | 9/2012 | Siegel et al. | |
| 8,423,404 B2 | 4/2013 | Bowles et al. | |
| 8,429,021 B2 | 4/2013 | Kraft et al. | |
| 8,463,646 B2 | 6/2013 | Bowles et al. | |
| 8,543,358 B2 | 9/2013 | Trabona | |
| 8,566,183 B1 | 10/2013 | Bonar et al. | |
| 8,606,633 B2 | 12/2013 | Tarbert et al. | |
| 8,718,717 B2 | 5/2014 | Vaknin et al. | |
| 8,743,215 B1 | 6/2014 | Lee | |
| 8,824,136 B1 | 9/2014 | Interian et al. | |
| 9,010,627 B1 | 4/2015 | Prasad et al. | |
| 9,043,026 B2 | 5/2015 | Lien et al. | |
| 9,195,979 B2 | 11/2015 | Geller | |
| 9,317,989 B2 | 4/2016 | Grow et al. | |
| 9,582,101 B2 | 2/2017 | Chang et al. | |
| 9,595,238 B2 | 3/2017 | Won | |
| 9,818,160 B2 | 11/2017 | Bowles et al. | |
| 9,881,284 B2 | 1/2018 | Bowles et al. | |
| 9,911,102 B2 | 3/2018 | Bowles | |
| 10,032,140 B2 | 7/2018 | Bowles et al. | |
| 10,055,798 B2 | 8/2018 | Bowles et al. | |
| 10,127,647 B2 | 11/2018 | Forutanpour et al. | |
| 2001/0039531 A1 | 11/2001 | Aoki | |
| 2002/0014577 A1 | 2/2002 | Ulrich et al. | |
| 2002/0035515 A1 | 3/2002 | Moreno | |
| 2002/0067184 A1 | 6/2002 | Smith et al. | |
| 2002/0087413 A1 | 7/2002 | Mahaffy et al. | |
| 2002/0129170 A1 | 9/2002 | Moore et al. | |
| 2002/0157033 A1 | 10/2002 | Cox | |
| 2002/0162966 A1 | 11/2002 | Yoder | |
| 2002/0186878 A1 | 12/2002 | Hoon et al. | |
| 2003/0006277 A1 | 1/2003 | Maskatiya et al. | |
| 2003/0018897 A1 | 1/2003 | Bellis et al. | |
| 2003/0036866 A1 | 2/2003 | Nair et al. | |
| 2003/0061150 A1 | 3/2003 | Kocher | |
| 2003/0146898 A1 | 8/2003 | Kawasaki et al. | |
| 2003/0170529 A1 | 9/2003 | Sagawa | |
| 2003/0197782 A1 | 10/2003 | Ashe | |
| 2003/0204289 A1 | 10/2003 | Banerjee et al. | |
| 2004/0012825 A1 | 1/2004 | Tesavis | |
| 2004/0114153 A1 | 6/2004 | Andersen et al. | |
| 2004/0141320 A1 | 7/2004 | Bock et al. | |
| 2004/0150815 A1 | 8/2004 | Sones et al. | |
| 2004/0156557 A1 | 8/2004 | Van Der Weij | |
| 2004/0156667 A1 | 8/2004 | Berger et al. | |
| 2004/0186744 A1 | 9/2004 | Lux | |
| 2004/0205015 A1 | 10/2004 | DeLaCruz | |
| 2004/0235513 A1 | 11/2004 | O'Connell | |
| 2004/0242216 A1 | 12/2004 | Boutsikakis | |
| 2004/0262521 A1 | 12/2004 | Devitt et al. | |
| 2005/0027622 A1 | 2/2005 | Walker et al. | |
| 2005/0128551 A1 | 6/2005 | Yang | |
| 2005/0137942 A1 | 6/2005 | LaFleur | |
| 2005/0139661 A1 | 6/2005 | Eglen et al. | |
| 2005/0143149 A1 | 6/2005 | Becker et al. | |
| 2005/0167620 A1 | 8/2005 | Cho et al. | |
| 2005/0187657 A1 | 8/2005 | Hashimoto et al. | |
| 2005/0216120 A1 | 9/2005 | Rosenberg et al. | |
| 2005/0222690 A1 | 10/2005 | Wang et al. | |
| 2005/0231595 A1 | 10/2005 | Wang et al. | |
| 2005/0240958 A1 | 10/2005 | Nguyen et al. | |
| 2006/0038114 A9 | 2/2006 | Cofer et al. | |
| 2006/0047573 A1 | 3/2006 | Mitchell et al. | |
| 2006/0074756 A1 | 4/2006 | Boykin | |
| 2006/0167580 A1 | 7/2006 | Whittier | |
| 2006/0184379 A1 | 8/2006 | Tan et al. | |
| 2006/0195384 A1 | 8/2006 | Bauer et al. | |
| 2006/0217152 A1 | 9/2006 | Fok et al. | |
| 2006/0229108 A1 | 10/2006 | Cehelnik | |
| 2006/0235747 A1 | 10/2006 | Hammond et al. | |
| 2006/0261931 A1 | 11/2006 | Cheng | |
| 2006/0271431 A1 | 11/2006 | Wehr et al. | |
| 2006/0279307 A1 | 12/2006 | Wang et al. | |

(56) References Cited

U.S. PATENT DOCUMENTS

| | | |
|---|---|---|
| 2006/0280356 A1 | 12/2006 | Yamagishi |
| 2007/0013124 A1 | 1/2007 | Graef et al. |
| 2007/0057815 A1 | 3/2007 | Foy et al. |
| 2007/0129906 A1 | 6/2007 | Stoecker et al. |
| 2007/0133844 A1 | 6/2007 | Waehner et al. |
| 2007/0140310 A1 | 6/2007 | Rolton et al. |
| 2007/0150403 A1 | 6/2007 | Mock et al. |
| 2007/0205751 A1 | 9/2007 | Suzuki et al. |
| 2007/0263099 A1 | 11/2007 | Motta et al. |
| 2007/0269099 A1 | 11/2007 | Nishino et al. |
| 2007/0281734 A1 | 12/2007 | Mizrachi |
| 2008/0004828 A1 | 1/2008 | Mizrachi |
| 2008/0027581 A1 | 1/2008 | Saether et al. |
| 2008/0033596 A1 | 2/2008 | Fausak et al. |
| 2008/0097770 A1 | 4/2008 | Low et al. |
| 2008/0109746 A1 | 5/2008 | Mayer |
| 2008/0111989 A1 | 5/2008 | Dufour et al. |
| 2008/0149720 A1 | 6/2008 | Colville |
| 2008/0177598 A1 | 7/2008 | Davie |
| 2008/0207198 A1 | 8/2008 | Juric |
| 2008/0231113 A1 | 9/2008 | Guccione et al. |
| 2008/0255901 A1 | 10/2008 | Carroll et al. |
| 2008/0256008 A1 | 10/2008 | Kwok |
| 2008/0281691 A1 | 11/2008 | Pearson et al. |
| 2008/0296374 A1 | 12/2008 | Gonen et al. |
| 2008/0303915 A1 | 12/2008 | Omi |
| 2008/0306701 A1 | 12/2008 | Zhong et al. |
| 2009/0051907 A1 | 2/2009 | Li et al. |
| 2009/0078775 A1 | 3/2009 | Giebel et al. |
| 2009/0079388 A1 | 3/2009 | Reddy |
| 2009/0095047 A1 | 4/2009 | Patel et al. |
| 2009/0160668 A1 | 6/2009 | Crowley et al. |
| 2009/0184865 A1 | 7/2009 | Valo et al. |
| 2009/0190142 A1 | 7/2009 | Taylor et al. |
| 2009/0207743 A1 | 8/2009 | Huq et al. |
| 2009/0244285 A1 | 10/2009 | Chathukutty |
| 2009/0247133 A1 | 10/2009 | Holmen et al. |
| 2009/0251815 A1 | 10/2009 | Wang et al. |
| 2009/0262341 A1 | 10/2009 | Konopa et al. |
| 2009/0265035 A1 | 10/2009 | Jenkinson et al. |
| 2009/0299543 A1 | 12/2009 | Cox et al. |
| 2009/0312009 A1 | 12/2009 | Fishel |
| 2009/0321511 A1 | 12/2009 | Browne |
| 2010/0005004 A1 | 1/2010 | Hudak et al. |
| 2010/0063894 A1 | 3/2010 | Lundy |
| 2010/0088192 A1 | 4/2010 | Bowles et al. |
| 2010/0110174 A1 | 5/2010 | Leconte |
| 2010/0115887 A1 | 5/2010 | Schroeder et al. |
| 2010/0147953 A1 | 6/2010 | Barkan |
| 2010/0157280 A1 | 6/2010 | Kusevic et al. |
| 2010/0161397 A1 | 6/2010 | Gauthier et al. |
| 2010/0169231 A1 | 7/2010 | Bowles et al. |
| 2010/0219234 A1 | 9/2010 | Forbes |
| 2010/0228676 A1 | 9/2010 | Librizzi et al. |
| 2010/0235198 A1 | 9/2010 | Fini et al. |
| 2010/0237854 A1 | 9/2010 | Kumhyr et al. |
| 2010/0262481 A1 | 10/2010 | Baker et al. |
| 2011/0035322 A1 | 2/2011 | Lively |
| 2011/0043628 A1 | 2/2011 | Yun |
| 2011/0060641 A1 | 3/2011 | Grossman |
| 2011/0067520 A1 | 3/2011 | Ihrke et al. |
| 2011/0235853 A1 | 9/2011 | Bowles et al. |
| 2011/0313840 A1 | 12/2011 | Mason et al. |
| 2012/0016518 A1 | 1/2012 | Saario et al. |
| 2012/0026582 A1 | 2/2012 | Okabe et al. |
| 2012/0029985 A1 | 2/2012 | Wilson et al. |
| 2012/0030097 A1 | 2/2012 | Hagan et al. |
| 2012/0054113 A1 | 3/2012 | Jayaraman et al. |
| 2012/0063501 A1 | 3/2012 | Aguren |
| 2012/0078413 A1 | 3/2012 | Baker, Jr. |
| 2012/0116928 A1 | 5/2012 | Gventer et al. |
| 2012/0116929 A1 | 5/2012 | Gventer et al. |
| 2012/0117001 A1 | 5/2012 | Gventer et al. |
| 2012/0127307 A1 | 5/2012 | Hassenzahl |
| 2012/0146956 A1 | 6/2012 | Jenkinson |
| 2012/0191562 A1 | 7/2012 | Bowles et al. |
| 2012/0235812 A1 | 9/2012 | De Mello et al. |
| 2012/0254046 A1 | 10/2012 | Librizzi et al. |
| 2012/0303431 A1 | 11/2012 | Phillips et al. |
| 2013/0034305 A1 | 2/2013 | Jahanshahi et al. |
| 2013/0046611 A1 | 2/2013 | Bowles et al. |
| 2013/0046699 A1 | 2/2013 | Bowles et al. |
| 2013/0124426 A1 | 5/2013 | Bowles et al. |
| 2013/0126741 A1 | 6/2013 | Srivastava et al. |
| 2013/0144797 A1 | 6/2013 | Bowles et al. |
| 2013/0155061 A1 | 6/2013 | Jahanshahi et al. |
| 2013/0173434 A1 | 7/2013 | Hartman |
| 2013/0181935 A1 | 7/2013 | McKenzie et al. |
| 2013/0191236 A1 | 7/2013 | Bowles |
| 2013/0198089 A1 | 8/2013 | Bowles |
| 2013/0198144 A1 | 8/2013 | Bowles |
| 2013/0226679 A1 | 8/2013 | Bowles |
| 2013/0246211 A1 | 9/2013 | Sullivan |
| 2013/0246212 A1 | 9/2013 | Sullivan |
| 2013/0253700 A1 | 9/2013 | Carson et al. |
| 2013/0275314 A1 | 10/2013 | Bowles |
| 2013/0284805 A1 | 10/2013 | Kraft et al. |
| 2013/0290146 A1 | 10/2013 | West et al. |
| 2013/0297388 A1 | 11/2013 | Kyle, Jr. et al. |
| 2014/0012643 A1 | 1/2014 | Behrisch |
| 2014/0038556 A1 | 2/2014 | De Sousa |
| 2014/0052329 A1 | 2/2014 | Amirpour |
| 2014/0067710 A1 | 3/2014 | Gventer et al. |
| 2014/0143161 A1 | 5/2014 | Ahn |
| 2014/0150100 A1 | 5/2014 | Gupta et al. |
| 2014/0156883 A1 | 6/2014 | Bowles |
| 2014/0214505 A1 | 7/2014 | Shuster-Arechiga et al. |
| 2014/0235258 A1 | 8/2014 | Chen et al. |
| 2014/0244315 A1 | 8/2014 | Cahill et al. |
| 2014/0347473 A1 | 11/2014 | Wolff et al. |
| 2015/0006281 A1 | 1/2015 | Takahashi |
| 2015/0066677 A1 | 3/2015 | Bowles et al. |
| 2015/0088731 A1 | 3/2015 | Ackerman |
| 2015/0120485 A1 | 4/2015 | Nash |
| 2015/0193797 A1 | 7/2015 | Gerrity |
| 2015/0206200 A1 | 7/2015 | Edmondson et al. |
| 2015/0278529 A1 | 10/2015 | Cho et al. |
| 2015/0332206 A1 | 11/2015 | Trew et al. |
| 2015/0356637 A1 | 12/2015 | Graffia et al. |
| 2016/0019685 A1 | 1/2016 | Nguyen |
| 2016/0055392 A1 | 2/2016 | Nakano |
| 2016/0092849 A1 | 3/2016 | Cirannek et al. |
| 2016/0098688 A1 | 4/2016 | Hunt et al. |
| 2016/0098689 A1 | 4/2016 | Bowles et al. |
| 2016/0098690 A1 | 4/2016 | Silva et al. |
| 2016/0125367 A1 | 5/2016 | Bowles et al. |
| 2016/0125548 A1 | 5/2016 | Bowles et al. |
| 2016/0125612 A1 | 5/2016 | Seki et al. |
| 2016/0132840 A1 | 5/2016 | Bowles et al. |
| 2016/0171456 A1 | 6/2016 | Bowles |
| 2016/0171544 A1 | 6/2016 | Heminger et al. |
| 2016/0171575 A1 | 6/2016 | Bowles et al. |
| 2016/0210648 A1 | 7/2016 | Cirannek |
| 2016/0269401 A1 | 9/2016 | Saito et al. |
| 2016/0275460 A1 | 9/2016 | Ploetner et al. |
| 2016/0275518 A1 | 9/2016 | Bowles et al. |
| 2016/0379287 A1 | 12/2016 | Dabiri |
| 2017/0083886 A1 | 3/2017 | Silva et al. |
| 2017/0091823 A1 | 3/2017 | Adinarayan et al. |
| 2017/0169401 A1 | 6/2017 | Beane et al. |
| 2017/0278191 A1 | 9/2017 | Tassone et al. |

FOREIGN PATENT DOCUMENTS

| | | |
|---|---|---|
| CN | 1957320 A1 | 5/2007 |
| CN | 200965706 Y | 10/2007 |
| CN | 102246384 | 11/2011 |
| CN | 202351953 U | 7/2012 |
| CN | 202394296 U | 8/2012 |
| CN | 102654927 A | 9/2012 |
| CN | 102812500 A1 | 12/2012 |
| CN | 102930642 A | 2/2013 |
| CN | 102976004 A | 3/2013 |
| CN | 103198562 A | 7/2013 |

(56) References Cited

FOREIGN PATENT DOCUMENTS

| | | |
|---|---|---|
| CN | 103226870 A | 7/2013 |
| CN | 203242065 U | 10/2013 |
| CN | 103440607 A | 12/2013 |
| CN | 103544772 A | 1/2014 |
| CN | 203408902 U | 1/2014 |
| CN | 103662541 A | 3/2014 |
| CN | 103679147 A | 3/2014 |
| CN | 103679147 A1 | 3/2014 |
| CN | 203520502 U | 4/2014 |
| CN | 203588366 U | 5/2014 |
| CN | 103954626 | 7/2014 |
| CN | 105513201 A1 | 4/2016 |
| EP | 1168253 A1 | 1/2002 |
| GB | 2167553 | 5/1986 |
| JP | 2007112801 A | 5/1995 |
| JP | H07334583 A | 12/1995 |
| JP | 2000-121564 A | 4/2000 |
| JP | 3123095 | 1/2001 |
| JP | 2002-019147 A | 1/2002 |
| JP | 2002183286 A | 6/2002 |
| JP | 2002-259528 A | 9/2002 |
| JP | 2002302252 A | 10/2002 |
| JP | 2002324264 A | 11/2002 |
| JP | 2002358354 A | 12/2002 |
| JP | 2003139516 A1 | 5/2003 |
| JP | 2003242243 A | 8/2003 |
| JP | 2003-267509 A | 9/2003 |
| JP | 2003264007 A | 9/2003 |
| JP | 2004021569 A | 1/2004 |
| JP | 2004-303102 A | 10/2004 |
| JP | 2004288143 A | 10/2004 |
| JP | 2004341681 A | 12/2004 |
| JP | 2006127308 A | 5/2006 |
| JP | 2006195814 A | 7/2006 |
| JP | 2006227764 A | 8/2006 |
| JP | 2006260246 A | 9/2006 |
| JP | 2007141266 A | 6/2007 |
| JP | 2007179516 A | 7/2007 |
| JP | 2007-265340 A | 10/2007 |
| JP | 2008522299 A | 6/2008 |
| JP | 2008293391 A | 12/2008 |
| JP | 2007086725 A1 | 4/2009 |
| JP | 2009086725 A | 4/2009 |
| JP | 2009245058 A | 10/2009 |
| JP | 2009250971 A1 | 10/2009 |
| JP | 2010177720 A | 8/2010 |
| JP | 2012058932 A | 3/2012 |
| JP | 2013033361 A | 2/2013 |
| JP | 2013037441 A | 2/2013 |
| JP | 2013551823 A1 | 8/2013 |
| KR | 20000064168 | 11/2000 |
| KR | 20130085255 A | 7/2013 |
| KR | 20140037543 A | 3/2014 |
| WO | WO-01/15096 A1 | 3/2001 |
| WO | 205176 A1 | 1/2002 |
| WO | WO-225613 | 3/2002 |
| WO | WO-2002039357 A1 | 5/2002 |
| WO | WO-2003012717 A1 | 2/2003 |
| WO | WO-2003014994 A1 | 2/2003 |
| WO | WO-2004021114 A2 | 3/2004 |
| WO | 2004114490 A1 | 12/2004 |
| WO | 2005008566 A1 | 1/2005 |
| WO | WO-2005101346 A1 | 10/2005 |
| WO | 2006058601 A1 | 6/2006 |
| WO | WO-2006080851 A2 | 8/2006 |
| WO | WO-2007066166 | 6/2007 |
| WO | 9128176 A1 | 10/2009 |
| WO | 2009128173 A1 | 10/2009 |
| WO | 2009129526 A1 | 10/2009 |
| WO | WO-2010/040116 A1 | 4/2010 |
| WO | WO-2010128267 A1 | 11/2010 |
| WO | WO-2010128315 A1 | 11/2010 |
| WO | WO-2011131016 A1 | 10/2011 |
| WO | 2012138679 A1 | 10/2012 |
| WO | WO-2013/063042 A1 | 5/2013 |
| WO | WO-2013074819 A1 | 5/2013 |
| WO | WO-2014075055 | 5/2014 |
| WO | 2015022409 A1 | 2/2015 |

OTHER PUBLICATIONS

CNET, "Tackling LCD "burn ins", and dead/stick Pixels", published Sep. 2, 2009, retrieved from http://www.cnet.com/news/tackling-lcd-burn-ins-and-deadstuck-pixels/.

Geekanoids, You Tube Video, "Apple iPhone 3GS Unboxing and Review", uploaded on Jun. 19, 2009, retrieved from http://www.youtube.com/watch?v=GCEi9QAeDqk on Sep. 2, 2009.

GSM Arena Glossary, "LCD (Liquid Crystal Display", retrieved from http://www.gsmarena.com/glossary.php3?term=lcd on Apr. 28, 2016, 1 page.

International Search Report and Written Opinion dated Dec. 15, 2015 in International Application No. PCT/US2015/052991, 17 pages.

Lambert, Emily, "Use It Up, Wear It Out", Forbes 175.5 (2005): 77-78. Business Source Complete. Web. Jan. 6, 2015, 3 pages.

Littleton Partners with Donations Ink (Jan. 19, 2006) US Fed News Service, Including US State News. Web. Jan. 6, 2015, 1 page.

MobileGazette.com, "2006 in Review: The Good, The Bad and The Ugly", published Dec. 2006, retrieved from http://www.mobilegazette.com/2006-revievv-06x12x22.htm on Nov. 11, 2015.

PC World, "Wipe Your Cell Phone's Memory Before Giving it Away", published Jan. 2006, retrieved from http://www.washingtonpost.com/wp-dyn/content/article/2006/01/30/AR2006013001144.html on Nov. 10, 2015.

Perng et al., "A Novel Vision System for CRT Panel Auto-Inspection", Proceedings of the 2005 IEEE International Conference on Mechatronics, Jul. 10-12, 2005, pp. 4.

Perng et al., "A Novel Vision System for CRT PaNnel Auto-Inspection". Journal of the Chinese Institute of Industrial Engineers, vol. 24, No. 5, pp. 341-350 (2007).

SimplySellular, "Get Cash for your Old Cell Phone", published Apr. 2, 2010, retrieved from http://simplysellular.com/conditions.php on Jan. 6, 2015, 2 pages.

Investopedia: What's the difference between weighted average accounting and FIFO/LILO accounting methods? Aug. 19, 2010. Accessed via archive.org [https://web.archive.org/web/20100819200402/http://www.investopedia.com/ask/answers/09/weighted-average-fifo-lilo-accounting.asp].

Kanter, James Max, "Color Crack:Identifying Cracks in Glass," dated Dec. 9, 2014; retrieved from the internet http://www.jmaxkanter.com/static/papers/color_crack.pdf on Sep. 22, 2017.

Oliveira, et al., "Automatic crack detection on road imagery using anisotropic diffusion and region linkage," 18th European Signal Processing Conference (EUSIPCO—2010), Aug. 23, 2010, pp. 274-278.

Zhang, Yiyang, "The design of glass crack detection system based on image preprocessing technology," 2014 IEEE 7th Joint International Information Technology and Artificial Intelligence Conference, IEEE, Dec. 20, 2014; pp. 39-42.

Co-Pending U.S. Appl. No. 15/130,851 of Forutanpour, B. et al., filed Apr. 15, 2016.

Co-Pending U.S. Appl. No. 15/195,828 of Forutanpour, B. et al., filed Jun. 28, 2016.

Co-Pending U.S. Appl. No. 15/630,508 of Silva, J. et al., filed Jun. 22, 2017.

Co-Pending U.S. Appl. No. 15/630,539 of Bowles, M. et al., filed Jun. 22, 2017.

Dennis Bournique: "Mobile Karma Shuts Down as iCloud and Blacklists Challenge Used Phone Buyers", Prepaid Phone News, Jul. 23, 2014 (Jul. 23, 2014), XP055229747, Retrieved from the Internet <URL:http://www.prepaidphonenews.com/2014/07/mobile-karma-shuts-down-as-icloud-and.html>; accessed Nov. 27, 2017; 2 pages.

Tecace Software: "Your phone appraisal—Movaluate—Android Apps on Google Play", Android Apps on Google Play, Aug. 12, 2013 (Aug. 12, 2013), XP055230264, Retrieved from the Internet

(56) References Cited

OTHER PUBLICATIONS

<URL:https://play.google.com/store/apps/details?id=com.tecace.android.app.movaluate&hl=en>, accessed Nov. 27, 2017; 2 pages.
Co-Pending U.S. Appl. No. 15/855,320 of Forutanpour et al., filed Dec. 27, 2017.
Graffia et al., "Retail Station for E-Device Identification, Assessment, and Trade-In", Jun. 6, 2014 (Drawings and Specification) (Year: 2014).
Trading devices for dollars, The Economist (US) 405.8813:8 (US), Economist Intelligence Unit N.A. Incorporated, Dec. 1, 2012.
Turner, "5 MP3 Players for Pumping Up Your Workouts," Mashable.com, Nov. 4, 2010, available online at https://mashable.com/2010/11/04/mp3-players-for-sports/ (Year: 2010).
Aftermarket Cellular Accessories, "Cellular Phone Model Identification," retrieved from http://web/archive.org/web/20060328064957/http://aftermarketcellular.com/ic/identification.html on Mar. 16, 2014, published Mar. 28, 2006, pp. 3.
Altec Lansing User's Guide 2007, 8 pages.
Business Wire, "The World's First Office Photography Machine" at CES 2008 Launched by Ortery technologies, Jan. 7, 2008, 3 pages.
Examination Report for Canadian Application No. 2,739,633, dated Dec. 6, 2013, 3 pages.
Evgenii Masunov, Mar. 25, 2010, http://www.appleinsider.ru/news/ipone-obladaet-luchshim-tachskrinom-provereno_robotom.html, 4 pages.
International Numbering Plan, www.numberingplans.com, 2 pages.
Office Action dated Apr. 8, 2013 for Chinese Application No. 200980148240.3, 12 pages.
Office Action dated Jan. 13, 2014 for Chinese Application No. 200980148240.3, 13 pages.
Office Action dated Aug. 6, 2013 in Japanese Patent Application No. 2011530284, 7 pages.
Office Action dated Jul. 1, 2014 in Japanese Patent Application No. 2011530284, 4 pages.
Office Action dated Sep. 3, 2012 in European Patent Application No. 09818605.9, 7 pages.
PCT international Search Report and Written Opinion dated Feb. 3, 2010 for PCT Application No. PCT/US09/59461, filed Oct. 2, 2008, 7 pages.
PCT International Search Report and Written Opinion dated Nov. 30, 2011 for PCT Application No. PCT/US2011/028251, filed Mar. 13, 2011, 8 pages.
PCT international Search Report and Written Opinion dated Jul. 5, 2012 for PCT Application PCT/US2012/032042, filed Apr. 4, 2012, 5 pages.
PCT International Search Report and Written Opinion dated Jan. 30, 2013 for PCT/US2013/023717 filed Jan. 30, 2013, 4 pages.
PCT international Search Report and Written Opinion dated Jan. 31, 2013 for PCT Application PCT/US2012/061587, filed Oct. 24, 2012, 11 pages.
PCT International Search Report and Written Opinion dated Apr. 3, 2014 for PCT/US2013/072697 filed Dec. 2, 2013, 7 pages.
PCT International Search Report and Written Opinion dated Jul. 18, 2014 for PCT Application No. PCT/US2014/024551, filed Mar. 12, 2014, 11 pages.
Rawson, Chris, "TUAW: 25 Ways to Check the Hardware on Your iPhone 4", published Aug. 13, 2010, retrieved at http://www.tuaw.com/2010/08/13/hardware-test-your-iphone-4/ on Feb. 28, 2014.
Rehg et al., Vision for a Smart Kiosk, 1997 IEEE Computer Society Conference on Computer Vision and Pattern Recognition. 7 pages.
Rolf Steinhilper, "Remanufacturing: The Ultimate Form of Recycling", Fraunhofer IRB Verlag, 1998, parts 1-3, ; http://www.reman.org/Publications_main.htm., 88 pages.
Yahoo! Answers, "What is a clean ESN?" published Jun. 23, 2009, retrieved from http://web.archive.org/web/20090623215042/http://answers.yahoo.com/question/inde,8020US?qid=20080318061012AANFRco on Apr. 3, 2014.
Co-pending U.S. Appl. No. 14/498,763, filed Sep. 26, 2014.
Co-pending U.S. Appl. No. 14/508,449, filed Oct. 3, 2014.
Co-pending U.S. Appl. No. 14/568,051, filed Dec. 11, 2014.

\* cited by examiner

MAINTAINING SETS OF CABLE COMPONENTS USED FOR WIRED ANALYSIS, CHARGING, OR OTHER INTERACTION WITH PORTABLE ELECTRONIC DEVICES

TECHNICAL FIELD

The present disclosure is related to methods and systems for maintaining sets of cable components used for wired analysis, charging, and/or other interactions with electronic devices, such as mobile phones and other portable electronic devices. In particular, at least some embodiments are related to methods and systems for testing cable components within these sets and replacing tested cable components found to be inoperable.

BACKGROUND

Consumer electronic devices, such as mobile phones, laptop computers, notebooks, tablets, MP3 players, etc., are ubiquitous. Currently there are over 6 billion mobile devices in use in the world; and the number of these devices is growing rapidly with more than 1.8 billion mobile phones being sold in 2013 alone. By 2017 it is expected that there will be more mobile devices in use than there are people on the planet. In addition to mobile phones, over 300 million desk-based and notebook computers shipped in 2013, and for the first time the number of tablet computers shipped exceeded laptops. Part of the reason for the rapid growth in the number of mobile phones and other electronic devices is the rapid pace at which these devices evolve, and the increased usage of such devices in third world countries.

As a result of the rapid pace of development, a relatively high percentage of electronic devices are replaced every year as consumers continually upgrade their mobile phones and other electronic devices to obtain the latest features or a better operating plan. According to the U.S. Environmental Protection Agency, the U.S. alone disposes of over 370 million mobile phones, PDAs, tablets, and other electronic devices every year. Millions of other outdated or broken mobile phones and other electronic devices are simply tossed into junk drawers or otherwise kept until a suitable disposal solution arises.

Although many electronic device retailers and cell carrier stores now offer mobile phone trade-in or buyback programs, many old mobile phones still end up in landfills or are improperly disassembled and disposed of in developing countries. Unfortunately, however, mobile phones and similar devices typically contain substances that can be harmful to the environment, such as arsenic, lithium, cadmium, copper, lead, mercury and zinc. If not properly disposed of, these toxic substances can seep into groundwater from decomposing landfills and contaminate the soil with potentiality harmful consequences for humans and the environment. As an alternative to retailer trade-in or buyback programs, consumers can now recycle and/or sell their used mobile phones using self-service kiosks located in malls, retail stores, or other publically accessible areas. Such kiosks are operated by ecoATM, Inc., the assignee of the present application, and are disclosed in, for example, U.S. Pat. Nos. 8,463,646, 8,423,404, 8,239,262, 8,200,533, 8,195,511, and 7,881,965, which are commonly owned by ecoATM, Inc. and are incorporated herein by reference in their entireties.

There continues to be a need for improving the means available to consumers for recycling or reselling their mobile phones and other electronic devices. Simplifying the recycling/reselling process, enhancing the consumer experience, and discouraging fraud can incentivize consumers to dispose of their old electronic devices in an efficient and environmentally conscientious way. To this end, there is a need for technology that improves the efficiency, reliability, and effectiveness of machines that process mobile phones and other electronic devices in conjunction with transactions in these devices. In the case of self-service kiosks, reducing machine down-time and cost-of-ownership tend to be particularly important. For example, in a large, highly dispersed network of self-service kiosks, even a small reduction in kiosk down-time and cost-of-ownership can have a significant impact on the efficiency and productivity of the network.

DETAILED DESCRIPTION

Figure 1:
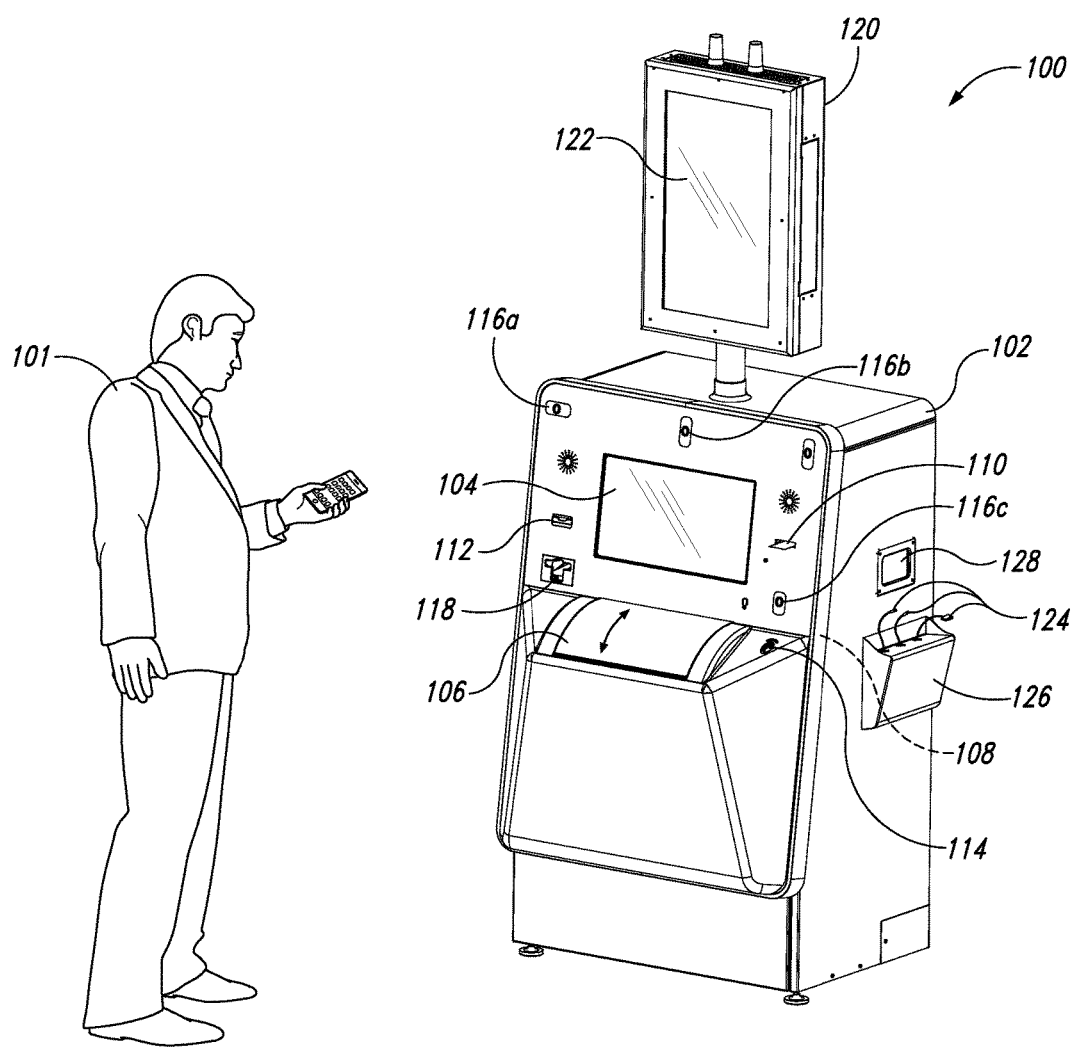
FIG. 1 is an isometric view of a machine configured in accordance with an embodiment of the present technology for recycling electronic devices.

The following disclosure describes, among other things, various embodiments of systems and methods for maintaining sets of cable components used for wired analysis, charging, and/or other interactions with portable electronic devices. At least some of the described embodiments are useful in the context of freestanding kiosks, countertop stations, and other types of partially or fully automated machines that evaluate and purchase mobile phones and other types of electronic devices from consumers. One example of a such a machine includes a set of Universal Serial Bus ("USB") cable components for wired analysis of an electronic device that a consumer intends to sell. The machine can be configured to automatically present the consumer with a USB cable component from the set of USB cable components and to request that the consumer connect the presented USB cable component to the electronic device. The machine can then use the resulting wired connection to electrically interact with the electronic device, such as to extract information (e.g., identifying information, specifications, inventories of components, etc.) from the electronic device, to test the electronic device for authenticity, and/or to test the electronic device for condition. In this context and others, USB and other types of cable components used to interact with electronic devices may occasionally be inoperable.

A cable component used to interact with electronic devices may be inoperable due to improper installation of the cable component, improper use of the cable component, ordinary wear and tear on the cable component, vandalism, or another cause. Improper installation of a cable component can occur, for example, when a cable component of one type is inadvertently installed at an installation location designated for a different type. Improper use of a cable component can occur, for example, when a user presented with a cable component forces a connector of the cable component into a damaged port, a non-standard port, or an incorrect port of an electronic device. In any case, to reduce or eliminate costly machine downtime associated with inoperable cable components, it can be useful for a machine to include redundant cable components. Such a machine may be capable of taking an inoperable cable component out of service and deploying a redundant cable component in place of the inoperable cable component. Due to space and other constraints, however, it can be impractical to include more than a few redundant cable components in any given machine. This is especially true when a machine uses multiple different types of cable components and includes redundant cable components for each type. To prevent a supply of redundant cable components in a machine from being exhausted, it can be useful to identify and replace inoperable cable components on a regular basis.

When an authorized person (e.g., a service technician) accesses a machine that uses cable components to interact with electronic devices, such as to unload or otherwise service the machine, the cable components may be visible to the authorized person. If one or more of the cable components is inoperable, it may be difficult or impossible for the authorized person to readily and reliably distinguish the inoperable cable components from operable cable components based on appearance alone. Replacing all of the cable components in such a machine every time the machine is serviced, however, can be unduly time-consuming and expensive. Accordingly, there is a need for technology that facilitates specific identification of inoperable cable components for replacement when a machine including a set of cable components is being serviced. Such technology has the potential to support highly efficient and scalable service protocols for large networks of machines that use cable components to interact with electronic devices.

Furthermore, there is a need for technology that facilitates identifying inoperable cable components before a machine is serviced, such as in real time. In a machine that uses cable components to interact with electronic devices, the presence of an inoperable cable component that is not recognized as inoperable and, therefore, has not been taken out of service, can be problematic. For example, use of the unrecognized inoperable cable component by a consumer may interfere with the reliability of a wired interaction between the machine and an electronic device belonging to the consumer. This may cause the machine to mischaracterize the electronic device or to reject the electronic device improperly. In some cases, a machine may presume that a cable component is inoperable when a consumer uses the cable component ineffectually or when a consumer affirmatively indicates that the cable component is inoperable. The machine may then take the cable component out of service and present the consumer with a replacement cable component. Unfortunately, this technique for identifying inoperable cable components to be taken out of service is prone to generating false positives (e.g., when a consumer mistakenly assumes that a cable component is inoperable) and negative user experiences (e.g., when a consumer initially presented with an inoperable cable component becomes confused or irritated).

Systems and methods in accordance with embodiments of the present technology can at least partially address one or more of the problems described above and/or other problems associated with relevant conventional technologies whether or not stated herein. For example, systems and methods in accordance with at least some embodiments of the present technology have features that facilitate testing cable components when a machine including the cable components is being serviced. Furthermore, at least some of these and other systems and methods in accordance with embodiments of the present technology have features that facilitate testing cable components when a machine including the cable components is not being serviced.

Certain details are set forth in the following description and in FIGS. 1-10 to provide a thorough understanding of various embodiments of the present technology. In other instances, well-known structures, materials, operations and/or systems often associated with smartphones and other handheld devices, consumer electronic devices, computer hardware, software, and network systems, etc. are not shown or described in detail in the following disclosure to avoid unnecessarily obscuring the description of the various embodiments of the present technology. Those of ordinary skill in the art will recognize, however, that the present technology can be practiced without one or more of the details set forth herein, or with other structures, methods, components, and so forth.

The terminology used below is to be interpreted in its broadest reasonable manner, even though it is being used in conjunction with a detailed description of certain examples of embodiments of the present technology. Indeed, certain terms may even be emphasized below; however, any terminology intended to be interpreted in any restricted manner will be specifically defined as such in this Detailed Description section.

The accompanying Figures depict embodiments of the present technology and are not intended to be limiting of its scope. The sizes of various depicted elements are not necessarily drawn to scale, and these various elements may be arbitrarily enlarged to improve legibility. Component details may be abstracted in the Figures to exclude details such as position of components and certain precise connections between such components when such details are unnecessary for a complete understanding of how to make and use the invention.

In the Figures, identical reference numbers identify identical, or at least generally similar, elements. To facilitate the discussion of any particular element, the most significant digit or digits of any reference number refers to the Figure in which that element is first introduced. For example, element 110 is first introduced and discussed with reference to FIG. 1.

FIG. 1 is an isometric view of a kiosk 100 for recycling and/or other processing of mobile phones and other consumer electronic devices in accordance with the present technology. In particular, the kiosk 100 can include technology for testing cable components and replacing tested cable components found to be inoperable. The term "processing" is used herein for ease of reference to generally refer to all manner of services and operations that may be performed or facilitated by the kiosk 100 on, with, or otherwise in relation to an electronic device. Such services and operations can include, for example, selling, reselling, recycling, donating, exchanging, identifying, evaluating, pricing, auctioning, decommissioning, transferring data from or to, reconfiguring, refurbishing, etc. mobile phones and other electronic devices. Although many embodiments of the present technology are described herein in the context of mobile phones, aspects of the present technology are not limited to mobile phones and generally apply to other consumer electronic devices. Such devices include, as non-limiting examples, all manner of mobile phones, smartphones, handheld devices, PDAs, MP3 players, tablet, notebook and laptop computers, e-readers, cameras, etc. In some embodiments, it is contemplated that the kiosk 100 can facilitate selling and/or otherwise processing larger consumer electronic devices, such as desktop computers, TVs, game consoles, etc., as well smaller electronic devices such as Google Glass™, smartwatches, etc. The kiosk 100 and various features thereof can be at least generally similar in structure and function to the kiosks and corresponding features described in U.S. Pat. Nos. 8,463,646, 8,423,404, 8,239,262, 8,200,533, 8,195,511, and 7,881,965; and in U.S. patent application Ser. Nos. 12/573,089, 12/727,624, 13/113,497, 12/785,465, 13/017,560, 13/438,924, 13/753, 539, 13/658,825, 13/733,984, 13/705,252, 13/487,299 13/492,835, 13/562,292, 13/658,828, 13/693,032, 13/792, 030, 13/794,814, 13/794,816, 13/862,395 and 13/913,408. All of the patents and patent applications listed in the preceding sentence are commonly owned by the applicant of the present application, and they along with any other patents or patent applications identified herein are incorporated herein by reference in their entireties.

In the illustrated embodiment, the kiosk 100 is a floor-standing self-service kiosk configured for use by a user 101 (e.g., a consumer, customer, etc.) to recycle, sell, and/or perform other operations with a mobile phone or other consumer electronic device. In other embodiments, the kiosk 100 can be configured for use on a countertop or a similar raised surface. Although the kiosk 100 is configured for use by consumers, in various embodiments the kiosk 100 and/or various portions thereof can also be used by other operators, such as a retail clerk or kiosk assistant to facilitate the selling or other processing of mobile phones and other electronic devices.

In the illustrated embodiment, the kiosk 100 includes a housing 102 that is approximately the size of a conventional vending machine. The housing 102 can be of conventional manufacture from, for example, sheet metal, plastic panels, etc. A plurality of user interface devices are provided on a front portion of the housing 102 for providing instructions and other information to users, and/or for receiving user inputs and other information from users. For example, the kiosk 100 can include a display screen 104 (e.g., a liquid crystal display (LCD) or light emitting diode (LED) display screen, a projected display (such as a heads-up display or a head-mounted device), and so on) for providing information, prompts, etc. to users. The display screen 104 can include a touch screen for receiving user input and responses to displayed prompts. In addition or alternatively, the kiosk 100 can include a separate keyboard or keypad for this purpose. The kiosk 100 can also include an ID reader or scanner 112 (e.g., a driver's license scanner), a fingerprint reader 114, and one or more cameras 116 (e.g., digital still and/or video cameras, identified individually as cameras 116a-c). The kiosk 100 can additionally include output devices such as a label printer having an outlet 110, and a cash dispenser having an outlet 118. Although not identified in FIG. 1, the kiosk 100 can further include a speaker and/or a headphone jack for audibly communicating information to users, one or more lights for visually communicating signals or other information to users, a handset or microphone for receiving verbal input from the user, a card reader (e.g., a credit/debit card reader, loyalty card reader, etc.), a receipt or voucher printer and dispenser, as well as other user input and output devices. The input devices may include a touchpad, a pointing device such as a mouse, a joystick, pen, game pad, motion sensor, scanner, eye direction monitoring system, etc. Additionally the kiosk 100 can also include a bar code reader, QR code reader, bag/package dispenser, a digital signature pad, etc. In the illustrated embodiment, the kiosk 100 additionally includes a header 120 having a display screen 122 for displaying marketing advertisements and/or other video or graphical information to attract users to the kiosk. In addition to the user interface devices described above, the front portion of the housing 102 also includes an access panel or door 106 located directly beneath the display screen 104. As described in greater detail below, the access door is configured to automatically retract so that the user 101 can place an electronic device (e.g., a mobile phone) in an inspection area 108 for automatic inspection by the kiosk 100.

A sidewall portion of the housing 102 can include a number of conveniences to help users recycle or otherwise process their mobile phones. For example, in the illustrated embodiment the kiosk 100 includes an accessory bin 128 that is configured to receive mobile device accessories that the user wishes to recycle or otherwise dispose of. Additionally, the kiosk 100 can provide a free charging station 126 with a plurality of electrical connectors 124 for charging a wide variety of mobile phones and other consumer electronic devices.

Figure 2B:
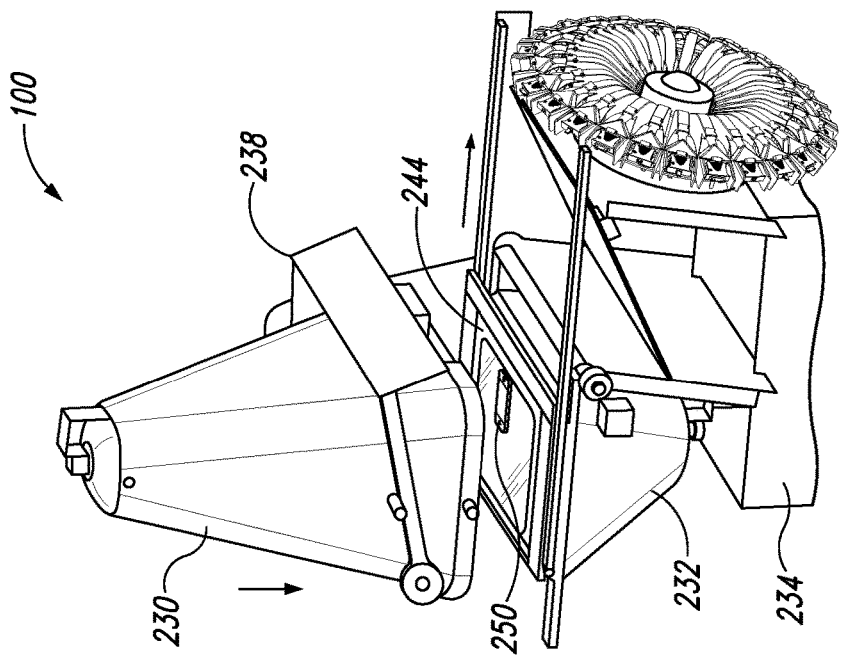
FIGS. 2A-2D are a series of isometric views of the machine of FIG. 1 with a number of exterior panels removed to illustrate operation of the machine in accordance with an embodiment of the present technology.
Figure 2A:
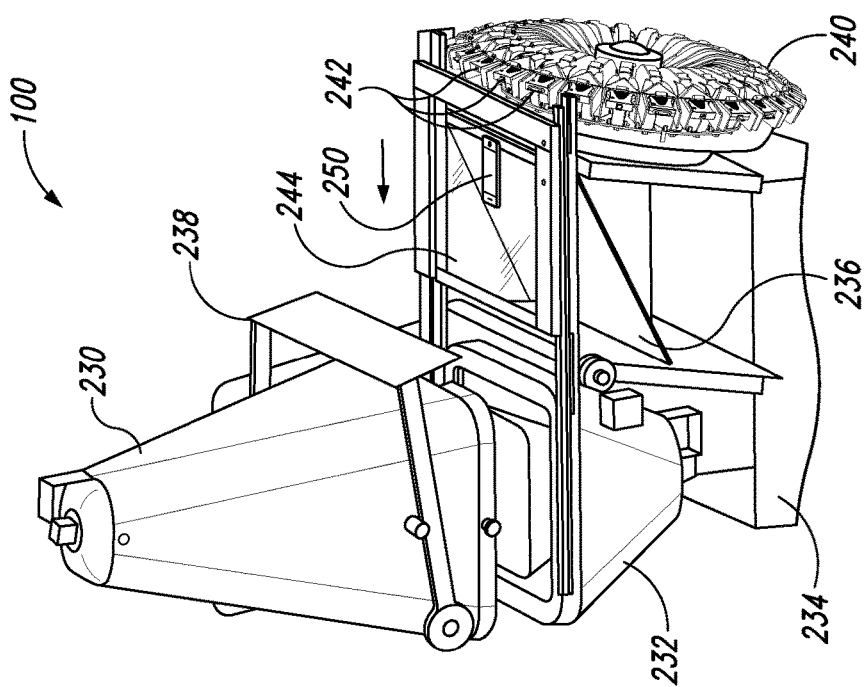

FIGS. 2A-2D are a series of isometric views of the kiosk 100 with the housing 102 removed to illustrate selected internal components configured in accordance with an embodiment of the present technology. Referring first to FIG. 2A, in the illustrated embodiment the kiosk 100 includes a connector carrier 240 and an inspection plate 244 operably disposed behind the access door 106 (FIG. 1). As discussed below, the connector carrier 240 and the inspection plate 244 can be components of a cable system and a staging apparatus, respectively. In the illustrated embodiment, the connector carrier 240 is a rotatable carrousel that is configured to rotate about a generally horizontal axis and carries a plurality of electrical connectors 242 (e.g., approximately 25 connectors) distributed around an outer periphery thereof. In other embodiments, other types of connector carrying devices (including both fixed and movable arrangements) can be used. In some embodiments, the connectors 242 can include a plurality of interchangeable USB connectors configured to provide power and/or exchange data with a variety of different mobile phones and/or other electronic devices. In operation, the carrousel 240 is configured to automatically rotate about its axis to position an appropriate one of the connectors 242 adjacent to an electronic device, such as a mobile phone 250, that has been placed on the inspection plate 244 for recycling. The connector 242 can then be manually and/or automatically withdrawn from the carousel 240 and connected to a port on the mobile phone 250 for electrical analysis. Such analysis can include, e.g., an evaluation of make, model, configuration, condition, etc. using one or more of the methods and/or systems described in detail in the commonly owned patents and patent applications identified herein and incorporated by reference in their entireties.

In the illustrated embodiment, the inspection plate 244 is configured to translate back and forth (on, e.g., parallel mounting tracks) to move an electronic device, such as the mobile phone 250, between a first position directly behind the access door 106 and a second position between an upper chamber 230 and an opposing lower chamber 232. Moreover, in this embodiment the inspection plate 244 is transparent, or at least partially transparent (e.g., formed of glass, Plexiglas, etc.) to enable the mobile phone 250 to be photographed and/or otherwise optically evaluated from all, or at least most viewing angles (e.g., top, bottom, sides, etc.) using, e.g., one or more cameras, mirrors, etc. mounted to or otherwise associated with the upper and lower chambers 230 and 232. When the mobile phone 250 is in the second position, the upper chamber 230 can translate downwardly to generally enclose the mobile phone 250 between the upper chamber 230 and the lower chamber 232. The upper chamber 230 is operably coupled to a gate 238 that moves up and down in unison with the upper chamber 230. As noted above, in the illustrated embodiment the upper chamber 230 and/or the lower chamber 232 can include one or more cameras, magnification tools, scanners (e.g., bar code scanners, infrared scanners, etc.) or other imaging components (not shown) and an arrangement of mirrors (also not shown) to view, photograph and/or otherwise visually evaluate the mobile phone 250 from multiple perspectives. In some embodiments, one or more of the cameras and/or other imaging components discussed above can be movable to facilitate device evaluation. The inspection area 108 can also include weight scales, heat detectors, UV readers/detectors, and the like for further evaluation of electronic devices placed therein. The kiosk 100 can further include an angled binning plate 236 for directing electronic devices from the transparent plate 244 into a collection bin 234 positioned in a lower portion of the kiosk 100.

The kiosk 100 can used in a number of different ways to efficiently facilitate the recycling, selling and/or other processing of mobile phones and other consumer electronic devices. Referring to FIGS. 1-2D together, in one embodiment a user wishing to sell a used mobile phone, such as the mobile phone 250, approaches the kiosk 100 and identifies the type of device the user wishes to sell in response to prompts on the display screen 104. Next, the user may be prompted to remove any cases, stickers, or other accessories from the device so that it can be accurately evaluated. Additionally, the kiosk 100 may print and dispense a unique identification label (e.g., a small adhesive-backed sticker with a QR code, barcode, etc.) from the label outlet 110 for the user to adhere to the back of the mobile phone 250. After this is done, the door 106 retracts allowing the user to place the mobile phone 250 onto the transparent plate 244 in the inspection area 108 (FIG. 2A). The door 106 then closes and the transparent plate 244 moves the phone 250 under the upper chamber 230 as shown in FIG. 2B. The upper chamber 230 then moves downwardly to generally enclose the mobile phone 250 between the upper and lower chambers 230 and 232, and the cameras and/or other imaging components in the upper and lower chambers 230 and 232 perform a visual inspection of the phone 250. In some embodiments, the visual inspection can include a 3D visual analysis to confirm the identification of the mobile phone 250 (e.g. make and model) and/or to evaluate or assess the condition and/or function of the phone 250 and/or its various components and systems. For example, the visual analysis can include an inspection of a display screen on the phone 250 for cracks or other damage. In some embodiments, the kiosk 100 can perform the visual analysis using one or more of the methods and/or systems described in detail in the commonly owned patents and patent applications identified herein and incorporated by reference in their entireties.

Figure 2C:
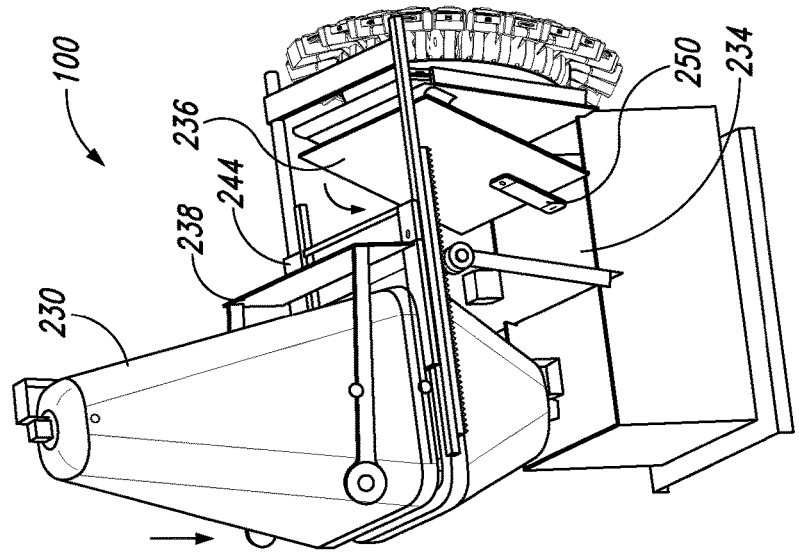
Figure 2D:
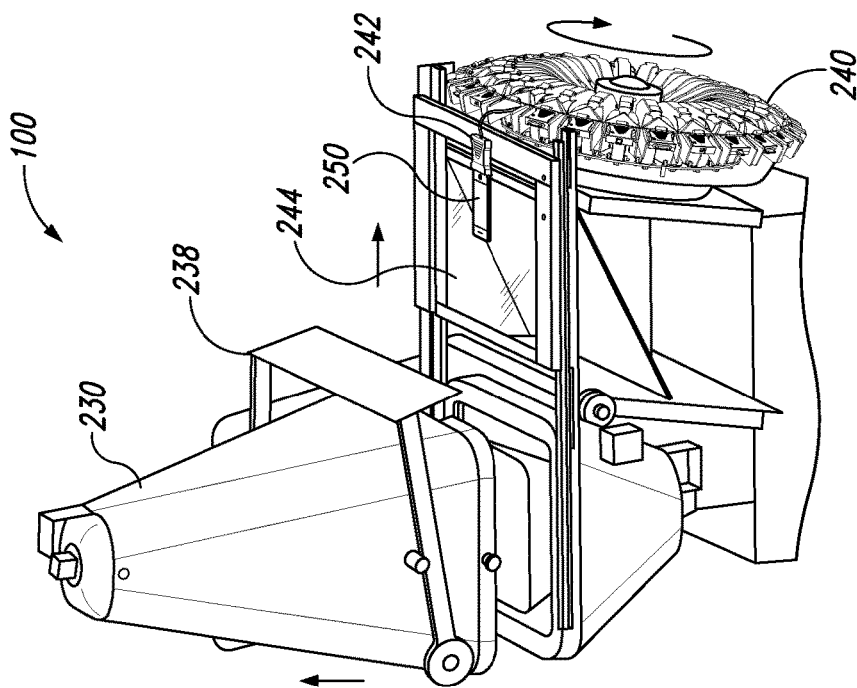

Referring next to FIG. 2C, after the visual analysis is performed and the device has been identified, the upper chamber 230 returns to its upper position and the transparent plate 244 returns the phone 250 to its initial position next to the door 106. The display screen 104 can also provide an estimated price or an estimated range of prices that the kiosk 100 may offer the user for the phone 250 based on the visual analysis and/or based on user input (e.g., input regarding the type, condition, etc. of the phone 250). If the user wishes to proceed with the transaction, the carrousel 240 automatically rotates an appropriate one of the connectors 242 into position adjacent the transparent plate 244, and door 106 is again opened. The user can then be instructed (via, e.g., the display screen 104) to withdraw the connector 242 (and its associated wire) from the carrousel 240, plug the connector 242 into the corresponding port (e.g., a USB port) on the phone 250, and reposition the phone 250 in the inspection area on the transparent plate 244. After doing so, the door 106 once again closes and the kiosk 100 performs an electrical inspection of the device to further evaluate the condition of the phone as well as specific component and operating parameters such as memory, carrier, etc. In some embodiments, the kiosk 100 can perform the electrical analysis using one or more of the methods and/or systems described in detail in the commonly owned patents and patent applications identified herein and incorporated by reference in their entireties.

After the visual and electronic analysis of the mobile phone 250, the user can be presented with a phone purchase price via the display screen 104. If the user declines the price (via, e.g., the touch screen), a retraction mechanism (not shown) automatically disconnects the connector 242 from the phone 250, the door 106 opens, and the user can reach in and retrieve the phone 250. If the user accepts the price, the door 106 remains closed and the user may be prompted to place his or her identification (e.g., a driver's license) in the ID scanner 112 and provide a thumbprint via the fingerprint reader 114. As a fraud prevention measure, the kiosk 100 can be configured to transmit an image of the driver's license to a remote computer screen, and an operator at the remote computer can visually compare the picture (and/or other information) on the driver's license to an image of the person standing in front of the kiosk 100 as viewed by one or more of the cameras 116a-c (FIG. 1) to confirm that the person attempting to sell the phone 250 is in fact the person identified by the driver's license. In some embodiments, one or more of the cameras 116a-c can be movable to facilitate viewing of kiosk users, as well as other individuals in the proximity of the kiosk 100. Additionally, the person's fingerprint can be checked against records of known fraud perpetrators. If either of these checks indicate that the person selling the phone presents a fraud risk, the transaction can be declined and the mobile phone 250 returned. After the user's identity has been verified, the transparent plate 244 moves back toward the upper and lower chambers 230 and 232. As shown in FIG. 2D, however, when the upper chamber 230 is in the lower position the gate 238 permits the transparent plate 244 to slide underneath but not electronic devices carried thereon. As a result, the gate 238 knocks the phone 150 off of the transparent plate 244, onto the binning plate 236 and into the bin 234. The kiosk can then provide payment of the purchase price to the user. In some embodiments, payment can be made in the form of cash dispensed from the cash outlet 118. In other embodiments, the user can receive remuneration for the mobile phone 150 in various other useful ways. For example, the user can be paid via a redeemable cash voucher, a coupon, an e-certificate, a prepaid card, a wired or wireless monetary deposit to an electronic account (e.g., a bank account, credit account, loyalty account, online commerce account, mobile wallet, etc.), Bitcoin, etc.

As those of ordinary skill in the art will appreciate, the foregoing routine is but one example of a way in which the kiosk 100 can be used to recycle or otherwise process consumer electronic devices such as mobile phones. Although the foregoing example is described in the context of mobile phones, it should be understood that kiosk 100 and various embodiments thereof can also be used in a similar manner for recycling virtually any consumer electronic device, such as MP3 players, tablet computers, PDAs, and other portable devices, as well as other relatively non-portable electronic devices such as desktop computers, printers, devices for playing games, entertainment or other digital media on CDs, DVDs, Blu-ray, etc. Moreover, although the foregoing example is described in the context of use by a consumer, the kiosk 100 in various embodiments thereof can similarly be used by others, such as store clerk, to assist consumers in recycling, selling, exchanging, etc. their electronic devices.

Figure 3:
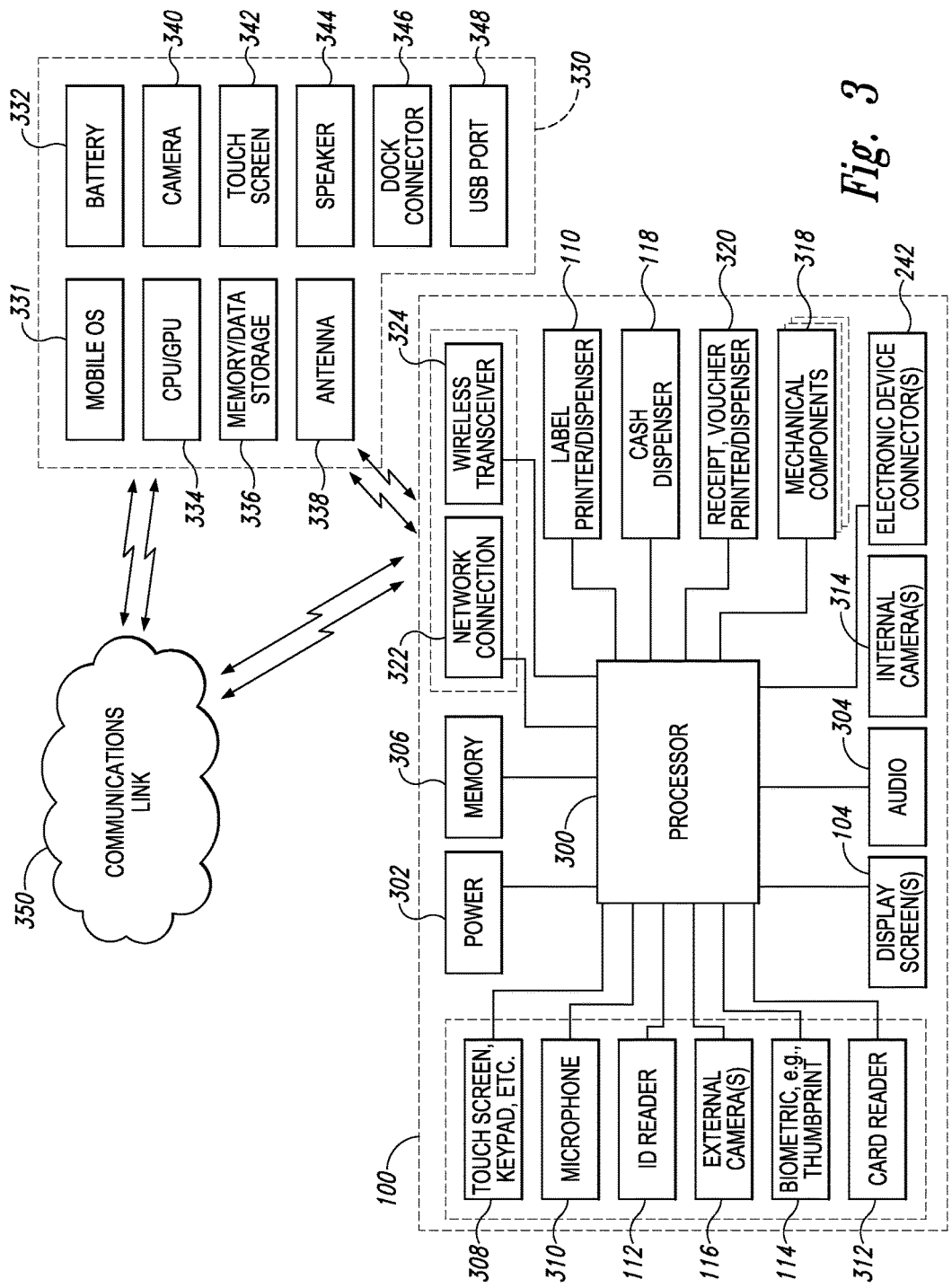
FIG. 3 is a schematic diagram illustrating various components associated with the machine of FIG. 1.

FIG. 3 provides a schematic representation of an architecture of the kiosk 100 in accordance with an embodiment of the present technology. In the illustrated embodiment, the kiosk 100 includes a suitable processor or central processing unit (CPU) 300 that controls operation of the kiosk 100 in accordance with computer-readable instructions stored on system memory 306. The CPU 300 may be any logic processing unit, such as one or more CPUs, digital signal processors (DSPs), application-specific integrated circuits (ASICs), etc. The CPU 300 may be a single processing unit or multiple processing units in a device or distributed across multiple devices. The CPU 300 is connected to the memory 306 and may be coupled to other hardware devices, for example, with the use of a bus (e.g., a PCI Express or Serial ATA bus). The CPU 300 can include, by way of example, a standard personal computer (PC) (e.g., a DELL OPTIPLEX 7010 PC) or other type of embedded computer running any suitable operating system, such as Windows, Linux, Android, iOS, or an embedded real-time operating system. In some embodiments, the CPU 300 can be a small form factor PC with integrated hard disk drive (HDD) or solid-state drive (SSD) and universal serial bus (USB) or other ports to communicate with the other components of the kiosk 100. In other embodiments, the CPU 300 can include a microprocessor with a standalone motherboard that interfaces with a separate HDD. The memory 306 can include read-only memory (ROM) and random access memory (RAM) or other storage devices, such as disk drives or SSDs, that store the executable applications, test software, databases and other software required to, for example, control kiosk components, process electronic device information and data (to, e.g., evaluate device make, model, condition, pricing, etc.), communicate and exchange data and information with remote computers and other devices, etc.

The CPU 300 can provide information and instructions to kiosk users via the display screen 104 and/or an audio system (e.g., a speaker) 304. The CPU 300 can also receive user inputs via, e.g., a touch screen 308 associated with the display screen 104, a keypad with physical keys, and/or a microphone 310. Additionally, the CPU 300 can receive personal identification and/or biometric information associated with users via the ID reader 112, one or more of the external cameras 116, and/or the fingerprint reader 114. In some embodiments, the CPU 300 can also receive information (such as user identification and/or account information) via a card reader 312 (e.g., a debit, credit, or loyalty card reader having, e.g., a suitable magnetic stripe reader, optical reader, etc.). The CPU 300 can also control operation of the label dispenser 110 and systems for providing remuneration to users, such as the cash dispenser 118 and/or a receipt or voucher printer and an associated dispenser 320.

As noted above, the kiosk 100 additionally includes a number of electronic, optical and electromechanical devices for electrically, visually and/or physically analyzing electronic devices placed therein for recycling. Such systems can include one more internal cameras 314 for visually inspecting electronic devices for, e.g., determining external dimensions and condition, and one or more of the electrical connectors 242 (e.g., USB connectors) for, e.g., powering up electronic devices and performing electronic analyses. As noted above, the cameras 314 can be operably coupled to the upper and lower chambers 230 and 232, and the connectors 242 can be movably and interchangeably carried by the carrousel 240 (FIGS. 2A-2D). The CPU 300 can control operation of the carrousel 240, such as to change which of the connectors 242 is presented to a user. The kiosk 100 further includes a plurality of mechanical components that are electronically actuated for carrying out the various functions of the kiosk 100 during operation. The mechanical components 318 can include, for example, the inspection area access door 106 and one or more of the movable components (e.g. the inspection plate 244, the upper and lower chambers 230 and 232, etc.) operably disposed within the inspection area 108 (FIG. 1). The kiosk 100 further includes power 302, which can include battery power and/or facility power for operation of the various electrical components associated with kiosk operation.

In the illustrated embodiment, the kiosk 100 further includes a network connection 322 (e.g., a wired connection, such as an Ethernet port, cable modem, FireWire cable, Lightning connector, USB port, etc.) suitable for communication with, e.g., all manner of remote processing devices via a communication link 350, and a wireless transceiver 324 (e.g., including a Wi-Fi access point, Bluetooth transceiver, near-field communication (NFC) device, and/or a wireless modem or cellular radio utilizing GSM, CDMA, 3G, and/or 4G technologies, each of which may include an associated antenna or antennas) for data communications suitable for communication with, e.g., all manner of remote processing devices via the communication link 350 and/or directly via, e.g., a wireless peer-to-peer connection. For example, the wireless transceiver 324 can facilitate wireless communication with handheld devices, such as a mobile device 330 (e.g., a smartphone) either in the proximity of the kiosk 100 or remote therefrom. By way of example only, in the illustrated embodiment the mobile device 330 can include one or more features, applications and/or other elements commonly found in smartphones and other known mobile devices. For example, the mobile device 330 can include a CPU and/or a graphics processing unit (GPU) 334 for executing computer readable instructions stored on memory 336. In addition, the mobile device 330 can include an internal power source or battery 332, a dock connector 346, a USB port 348, a camera 340, and/or well-known input devices, including, for example, a touch screen 342, a keypad, etc. In many embodiments, the mobile device 330 can also include a speaker 344 for two-way communication and audio playback. In addition to the foregoing features, the mobile device 330 can include a mobile operating system (OS) 331 and/or a device wireless transceiver that may include one or more antennas 338 for wirelessly communicating with, for example, other mobile devices, websites, and the kiosk 100. Such communication can be performed via, e.g., the communication link 350 (which can include the Internet, a public or private intranet, a local or extended Wi-Fi network, cell towers, the plain old telephone system (POTS), etc.), direct wireless communication, etc.

Unless described otherwise, the construction and operation of the various components shown in FIG. 3 are of conventional design. As a result, such components need not be described in further detail herein, as they will be readily understood by those skilled in the relevant art. In other embodiments, the kiosk 100 and/or the mobile device 330 can include other features that may be different from those described above. In still further embodiments, the kiosk 100 and/or the mobile device 330 can include more or fewer features similar to those described above.

Figure 4:
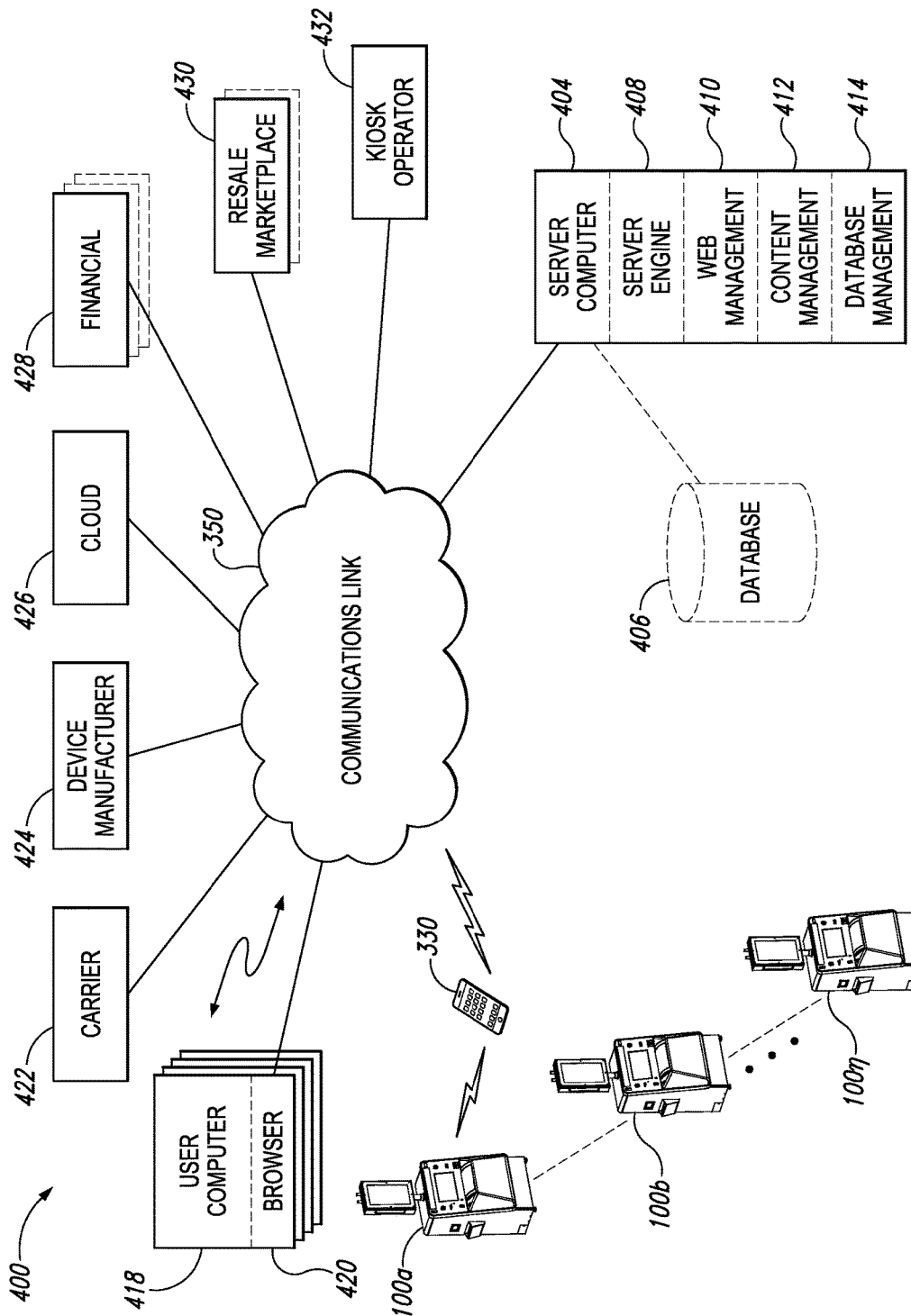
FIG. 4 is a schematic diagram of a suitable distributed computing environment for implementing various aspects of the present technology.

FIG. 4 is a schematic diagram of a suitable network environment for implementing various aspects of an electronic device recycling system 400 configured in accordance with embodiments of the present technology. In the illustrated embodiment, a plurality of the kiosks 100 (identified individually as kiosks 100a-100n) can exchange information with one or more remote computers (e.g., one or more server computers 404) via the communication link 350. Although the communication link 350 can include a publically available network (e.g., the Internet with a web interface), a private communication link, such as an intranet or other network can also be used. Moreover, in various embodiments the individual kiosk 100 can be connected to a host computer (not shown) that facilitates the exchange of information between the kiosks 100 and remote computers, other kiosks, mobile devices, etc.

The server computer 404 can perform many or all of the functions for receiving, routing and storing of electronic messages, such as webpages, audio signals and electronic images necessary to implement the various electronic transactions described herein. For example, the server computer 404 can retrieve and exchange web pages and other content with an associated database or databases 406. In some embodiments, the database 406 can include information related to mobile phones and/or other consumer electronic devices. Such information can include, for example, make, model, serial number, International Mobile Equipment Identity (IMEI) number, carrier plan information, pricing information, owner information, etc. In various embodiments the server computer 404 can also include a server engine 408, a web page management component 410, a content management component 412, and a database management component 414. The server engine 408 can perform the basic processing and operating system level tasks associated with the various technologies described herein. The webpage management component 410 can handle creation and/or display and/or routing of web or other display pages. The content management component 412 can handle many of the functions associated with the routines described herein. The database management component 414 can perform various storage, retrieval and query tasks associated with the database 406, and can store various information and data such as animation, graphics, visual and audio signals, etc.

In the illustrated embodiment, the kiosks 100 can also be operably connected to a plurality of other remote devices and systems via the communication link 350. For example, the kiosks 100 can be operably connected to a plurality of user devices 418 (e.g., personal computers, laptops, handheld devices, etc.) having associated browsers 420. Similarly, as described above the kiosks 100 can each include wireless communication facilities for exchanging digital information with mobile devices, such as the mobile device 330. The kiosks 100 and/or the server computer 404 are also operably connectable to a series of remote computers for obtaining data and/or exchanging information with necessary service providers, financial institutions, device manufactures, authorities, government agencies, etc. For example, the kiosks 100 and the server computer 404 can be operably connected to one or more cell carriers 422, one or more device manufacturers 424 (e.g., mobile phone manufacturers), one or more electronic payment or financial institutions 428, one or more databases (e.g., the GSMA IMEI Database, etc.), and one or more computers and/or other remotely located or shared resources associated with cloud computing 426. The financial institutions 428 can include all manner of entity associated with conducting financial transactions, including banks, credit/debit card facilities, online commerce facilities, online payment systems, virtual cash systems, money transfer systems, etc.

In addition to the foregoing, the kiosks 100 and the server computer 404 can also be operably connected to a resale marketplace 430 and a kiosk operator 432. The resale marketplace 430 represents a system of remote computers and/or services providers associated with the reselling of consumer electronic devices through both electronic and brick and mortar channels. Such entities and facilities can be associated with, for example, online auctions for reselling used electronic devices as well as for establishing market prices for such devices. The kiosk operator 432 can be a central computer or system of computers for controlling all manner of operation of the network of kiosks 100. Such operations can include, for example, remote monitoring and facilitating of kiosk maintenance (e.g., remote testing of kiosk functionality, downloading operational software and updates, etc.), servicing (e.g., periodic replenishing of cash and other consumables), performance, etc. In addition, the kiosk operator 432 can further include one or more display screens operably connected to cameras located at each of the kiosks 100 (e.g., one or more of the cameras 116 described above with reference to FIG. 1). This remote viewing capability enables operator personnel to verify user identification and/or make other visual observations at the kiosks 100 in real-time during transactions, as described above with reference to FIG. 1.

The foregoing description of the electronic device recycling system 400 illustrates but one possible network system suitable for implementing the various technologies described herein. Accordingly, those of ordinary skill in the art with appreciate that other systems consistent with the present technology can omit one or more of the facilities described in reference to FIG. 4, or can include one or more additional facilities not described in detail in FIG. 4.

The kiosks 100, mobile devices 330, server computers 404, user computers or devices 418, etc. can include one or more central processing units or other logic-processing circuitry, memory, input devices (e.g., keyboards and pointing devices), output devices (e.g., display devices and printers), and storage devices (e.g., magnetic, solid state, fixed and floppy disk drives, optical disk drives, etc.). Such computers can include other program modules such as an operating system, one or more application programs (e.g., word processing or spreadsheet applications), and the like. The computers can include wireless computers, such as mobile phones, personal digital assistants (PDA's), palmtop computers, etc., which communicate with the Internet via a wireless link. The computers may be general-purpose devices that can be programmed to run various types of applications, or they may be single-purpose devices optimized or limited to a particular function or class of functions. Aspects of the invention may be practiced in a variety of other computing environments.

While the Internet is shown, a private network, such as an intranet can likewise be used herein. The network can have a client-server architecture, in which a computer is dedicated to serving other client computers, or it can have other architectures such as peer-to-peer, in which one or more computers serve simultaneously as servers and clients. A database or databases, coupled to the server computer(s), stores much of the web pages and content exchanged between the user computers. The server computer(s), including the database(s), can employ security measures to inhibit malicious attacks on the system, and to preserve integrity of the messages and data stored therein (e.g., firewall systems, message encryption and/or authentication (e.g., using transport layer security (TLS) or secure sockets layer (SSL)), password protection schemes, encryption of stored data (e.g., using trusted computing hardware), and the like).

One skilled in the relevant art will appreciate that the concepts of the invention can be used in various environments other than location based or the Internet. In general, a display description can be in HTML, XML or WAP format, email format or any other format suitable for displaying information (including character/code-based formats, algorithm-based formats (e.g., vector generated), and bitmapped formats). Also, various communication channels, such as local area networks, wide area networks, or point-to-point dial-up connections, can be used instead of the Internet. The system can be conducted within a single computer environment, rather than a client/server environment. Also, the user computers can comprise any combination of hardware or software that interacts with the server computer, such as television-based systems and various other consumer products through which commercial or noncommercial transactions can be conducted. The various aspects of the invention described herein can be implemented in or for any e-mail environment.

Although not required, aspects of the invention are described in the general context of computer-executable instructions, such as routines executed by a general-purpose data processing device, e.g., a server computer, wireless device or personal computer. Those skilled in the relevant art will appreciate that aspects of the invention can be practiced with other communications, data processing, or computer system configurations, including: Internet appliances, handheld devices (including personal digital assistants (PDAs)), wearable computers, all manner of cellular or mobile phones (including Voice over IP (VoIP) phones), dumb terminals, media players, gaming devices, multi-processor systems, microprocessor-based or programmable consumer electronics, set-top boxes, network PCs, mini-computers, mainframe computers, and the like. Indeed, the terms "computer," "server," "host," "host system," and the like are generally used interchangeably herein, and refer to any of the above devices and systems, as well as any data processor.

Aspects of the invention can be embodied in a special purpose computer or data processor that is specifically programmed, configured, or constructed to perform one or more of the computer-executable instructions explained in detail herein. While aspects of the invention, such as certain functions, are described as being performed exclusively on a single device, the invention can also be practiced in distributed environments where functions or modules are shared among disparate processing devices, which are linked through a communications network, such as a Local Area Network (LAN), Wide Area Network (WAN), or the Internet. In a distributed computing environment, program modules can be located in both local and remote memory storage devices.

Aspects of the invention can be stored or distributed on tangible computer-readable media, including magnetically or optically readable computer discs, hard-wired or preprogrammed chips (e.g., EEPROM semiconductor chips), nanotechnology memory, biological memory, or other data storage media. The data storage devices can include any type of computer-readable media that can store data accessible by a computer, such as magnetic hard and floppy disk drives, optical disk drives, magnetic cassettes, tape drives, flash memory cards, DVDs, Bernoulli cartridges, RAM, ROMs, smart cards, etc. Indeed, any medium for storing or transmitting computer-readable instructions and data may be employed, including a connection port to a network such as a LAN, WAN, or the Internet. Alternatively, computer implemented instructions, data structures, screen displays, and other data under aspects of the invention can be distributed over the Internet or over other networks (including wireless networks), on a propagated signal on a propagation medium (e.g., an electromagnetic wave(s), a sound wave, etc.) over a period of time, or they can be provided on any analog or digital network (packet switched, circuit switched, or other scheme). The terms "memory" and "computer-readable storage medium" include any combination of temporary, persistent, and/or permanent storage, e.g., ROM, writable memory such as RAM, writable non-volatile memory such as flash memory, hard drives, solid state drives, removable media, and so forth, but do not include a propagating signal per se.

Figure 5:
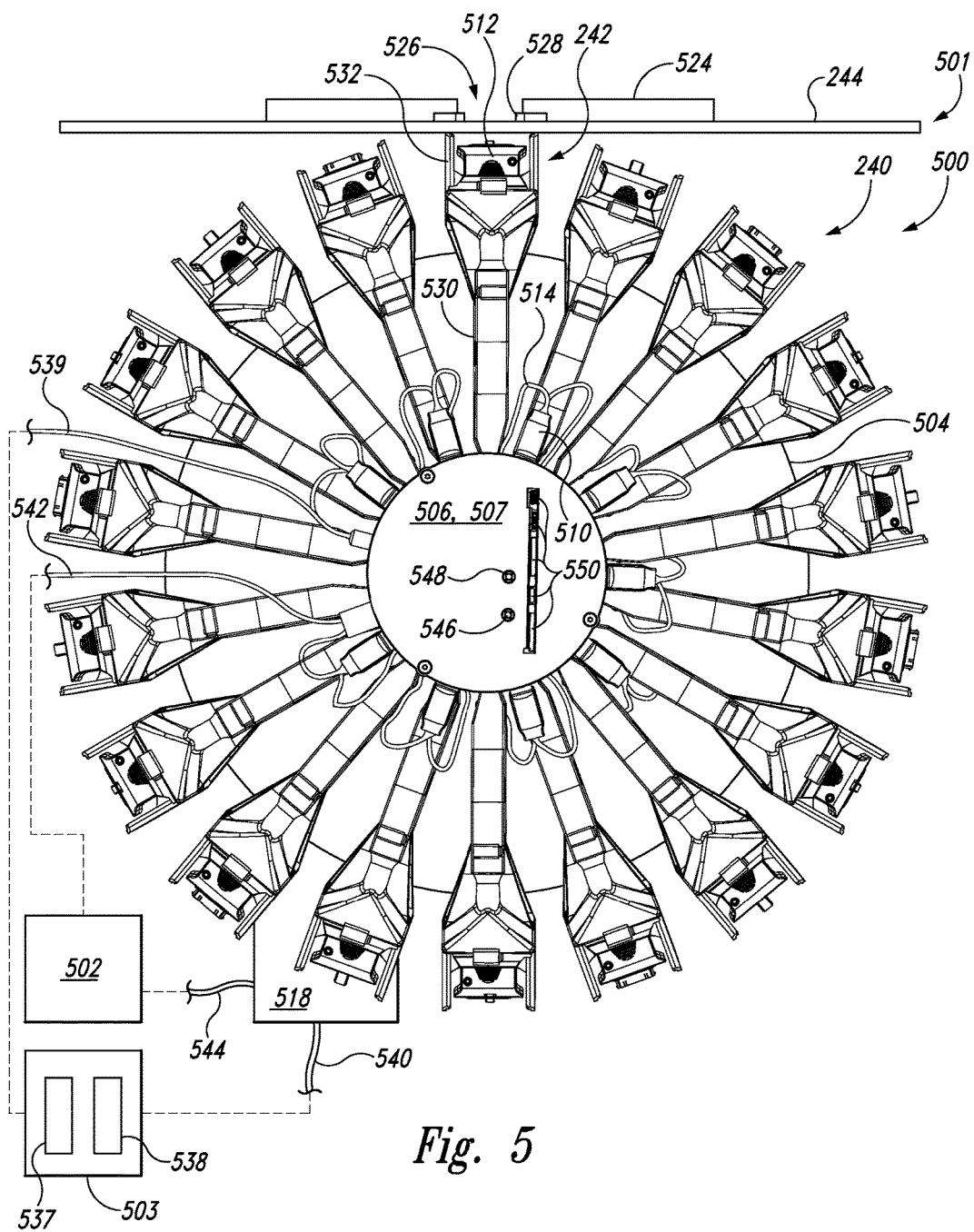
FIGS. 5 and 6 are, respectively, a front view and a plan view of a cable system, a staging apparatus, a power source, and a host computer that can be used with the machine shown in FIG. 1 in accordance with an embodiment of the present technology. The cable system in the illustrated embodiment includes a hub and cable components detachably connected to the hub. The hub in the illustrated embodiment includes a cover. The staging apparatus in the illustrated embodiment includes an opening.
Figure 6:
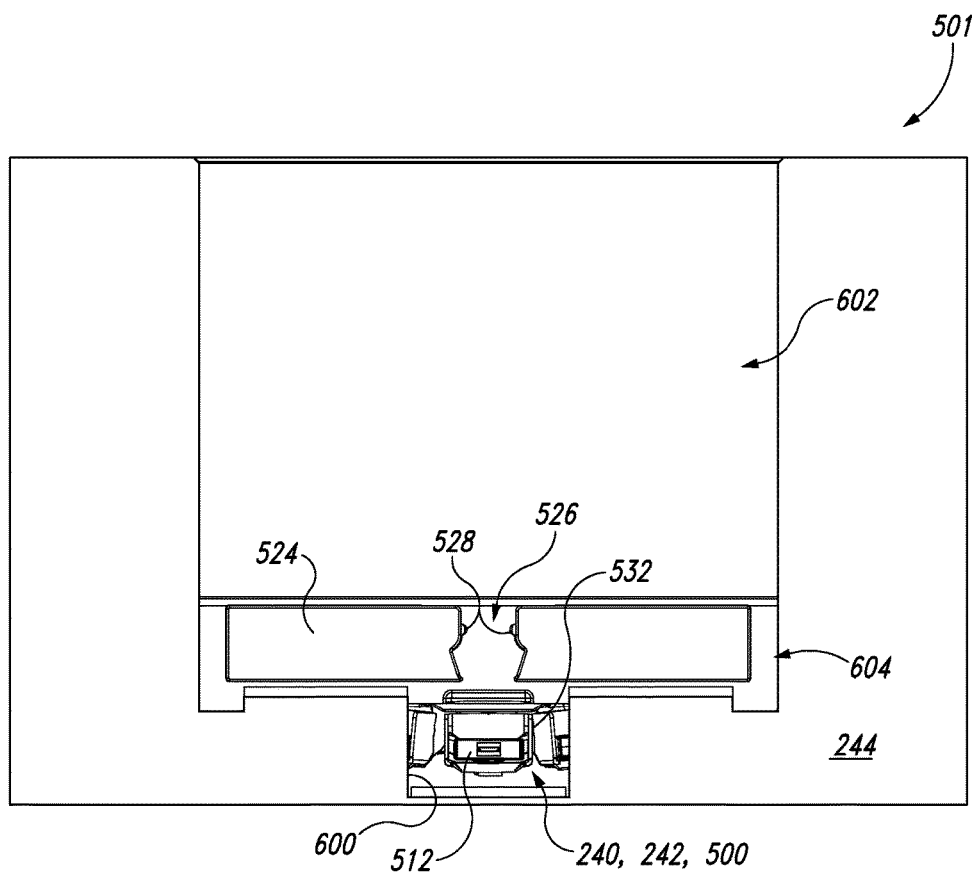

FIGS. 5 and 6 are, respectively, a front view and a plan view of a cable system 500, a staging apparatus 501, a power source 502, and a host computer 503 that can be used with the kiosk 100 (FIG. 1) in accordance with an embodiment of the present technology. For example, the cable system 500 can be disposed within the housing 102 (FIG. 1) and can include the carousel 240 and the connectors 242 discussed above with reference to FIGS. 2A-2D. Similarly, the staging apparatus can be disposed within the housing 102 and can include the inspection plate 244 discussed above with reference to FIGS. 2A-2D. With reference to FIGS. 5 and 6 together, the cable system 500 can include a circular backing plate 504 and a hub 506 having a circular cover 507 centrally positioned relative to the backing plate 504. The cable components 242 (one identified in FIG. 5) can be carried by the backing plate 504 and arranged circumferentially around the hub 506.

In the illustrated embodiment, each of the cable components 242 includes an upstream-facing USB or other suitable connector 510 (one identified in FIG. 5), a downstream-facing USB or other suitable connector 512 (one identified in FIG. 5), and a flexible cord 514 (one identified in FIG. 5) extending between the upstream-facing connector 510 and the downstream-facing connector 512. As shown in FIG. 5, each of the cable components 242 can be detachably coupled to the hub 506 via its upstream-facing connector 510. When detachably coupled to the hub 506 in this way, the proximal end portion of the corresponding cord 514 can be positioned downstream from the upstream-facing connector 510 and the distal end portion of the corresponding cord 514 can be positioned downstream from the proximal end portion of the cord 514. The downstream-facing connectors 512 can be attached to the distal end portions of the corresponding cords 514. The staging apparatus 501 can be aligned with a plane tangential to a circle along which the downstream-facing connectors 512 are positioned. The staging apparatus 501 can include an opening 600 (FIG. 6) aligned with a given one of the cable components 242. The cable component 242 aligned with the opening 600 can be staged for use or testing while the other cable components 242 are not staged for use or testing.

The cable system 500 can further include a drive mechanism 518 (shown schematically) operably connected to the cable components 242, such as via the backing plate 504. The drive mechanism 518 can be configured to move the cable components 242 and thereby change which one of the cable components 242 is staged for testing or use adjacent to the opening 600. For example, the backing plate 504, the hub 506, and the cable components 242 can be rotatable relative to the staging apparatus 501 and the drive mechanism 518 can be used to drive this rotation. The staging apparatus 501 can include a transparent inspection area 602 within the inspection plate 244 and a registering area 604 disposed between the inspection area 602 and the opening 600. At the registering area 604, the staging apparatus 501 can include a fence 524 defining an inset 526 aligned with the opening 600. The inset 526 can be shaped to register the downstream-facing connector 512 staged for testing or use so it has a preset position within the registering area 604. Correspondingly, an electronic device (not shown), detachably connected to the staged downstream-facing connector 512 can have a preset position within the inspection area 602. The staging apparatus 501 can further include two retractable protrusions 528 respectively positioned at opposite sides of the inset 526. When extended, the protrusions 528 can secure the staged downstream-facing connector 512 within the inset 526. When retracted, the protrusions 528 can release the staged downstream-facing connector 512 from within the inset 526.

As best seen in FIG. 5, each cable component 242 can include a shell 530 having a distally opening cradle 532 that receives a corresponding downstream-facing connector 512 for stowing when not in use. The cords 514 can be wound around spools (not shown) rotatably disposed within the shells 530. The spools can be resiliently biased (with, for example, tension springs) to wind and retract the cords 514. In at least some cases, a user of the cable system 500 can manually overcome this resilient bias to stage one of the downstream-facing connectors 512 within the inset 526. When the protrusions 528 are retracted, the resilient bias on one of the cords 514 corresponding to the staged downstream-facing connector 512 can cause the cord 514 to automatically retract. This can pull the staged downstream-facing connector 512 toward the corresponding cradle 532 until the downstream-facing connector 512 is stowed in the cradle 532.

In the illustrated embodiment, the cable system 500 includes 18 cable components 242. Further, in the illustrated embodiment, the upstream-facing connectors 510 are USB-A connectors of the same type. Still further, in the illustrated embodiment, the downstream-facing connectors 512 are USB-B connectors of one of three different types. In other embodiments, the cable system 500 can include more or fewer of the cable components 242, and/or the cable components 242 can have other suitable types of connectors, such as different types of proprietary connectors. With reference again to FIGS. 5 and 6 together, the cable components 242 can include adapters (not shown) disposed within the shells 530 to allow mismatches in parings of the upstream-facing connectors 510 and the corresponding downstream-facing connectors 512.

Uniformity of the upstream-facing connectors 510 among the cable components 242 combined with diversity among the downstream-facing connectors 512 of the cable components 242 may facilitate changes to a roster of connector types among the downstream-facing connectors 512. As an example, a quantity of one connector type among the downstream-facing connectors 512 may be increased and a quantity of another connector type among the downstream-facing connectors 512 may be decreased to accommodate an increase in demand for the one connecter type over the other. In at least some cases, a roster of connector types among the downstream-facing connectors 512 can be changed without necessitating structural or other significant changes to the hub 506. It should be noted that, in various embodiments of the present technology, cable components can be present in various suitable quantities and have other suitable rosters of upstream-facing connector types and/or downstream-facing connector types. Furthermore, in other embodiments, cable components can be present in other suitable arrangements, such as linear arrangements rather than circular arrangements.

The power source 502 and the host computer 503 can support operation of the cable system 500. The host computer 503 can include memory 537 and processing circuitry 538 and can be networked for electronic communication with the cable system 500, such as by connection to the drive mechanism 518 via a first communication line 539 and connection to the hub 506 via a second communication line 540. Similarly, the power source 502 can be configured to deliver power to the cable system 500, such as by connection to the drive mechanism 518 via a first power line 542 and connection to the hub 506 via a second power line 544. In the illustrated embodiment, the cable system 500 includes a first actuation mechanism 546 (e.g., a first button) and a second actuation mechanism 548 (e.g. a second button) accessible at an outside of the cover 507. Alternatively, the first and second actuation mechanisms 546, 548 can be accessible at another suitable location within the cable system 500. As described in additional detail below, the first actuation mechanism 546 can be manually operable to initiate a test of one of the cable components 242 that is staged for testing. The second actuation mechanism 548 can be manually operable to change which one of the cable components 242 is staged for testing. For example, in at least some embodiments, operating the second actuation mechanism 548 causes the drive mechanism 518 to rotate the backing plate 504, the hub 506, and the cable components 242 one increment, such that one of the cable components 242 that is staged for testing at the opening 600 is replaced by a neighboring one of the cable components 242.

The cable system 500 can include test ports 550 operably associated with the hub 506. Like the first and second actuation mechanisms 546, 548, the test ports 550 can be accessible at an outside of the cover 507. Alternatively, the test ports 550 can be accessible at another suitable location within the cable system 500. The test ports 550 can be connector ports, such as USB-A ports of two or more (e.g., three or more) different port types corresponding to two or more (e.g., three or more) different connector types present among the downstream-facing connectors 512. The different types of the test ports 550, for example, can correspond to different arrangements of electrical contacts (not shown) carried by the respective test ports 550. These arrangements can be in accordance with USB standards or in accordance with standards proprietary to different manufacturers of electronic devices. In the illustrated embodiment, a lineup of types among the test ports 550 includes USB-A mini, USB-A micro, and three different proprietary port types. In other embodiments, a lineup can include other suitable port types in addition to or instead of the port types included among the test ports 550.

Figure 7:
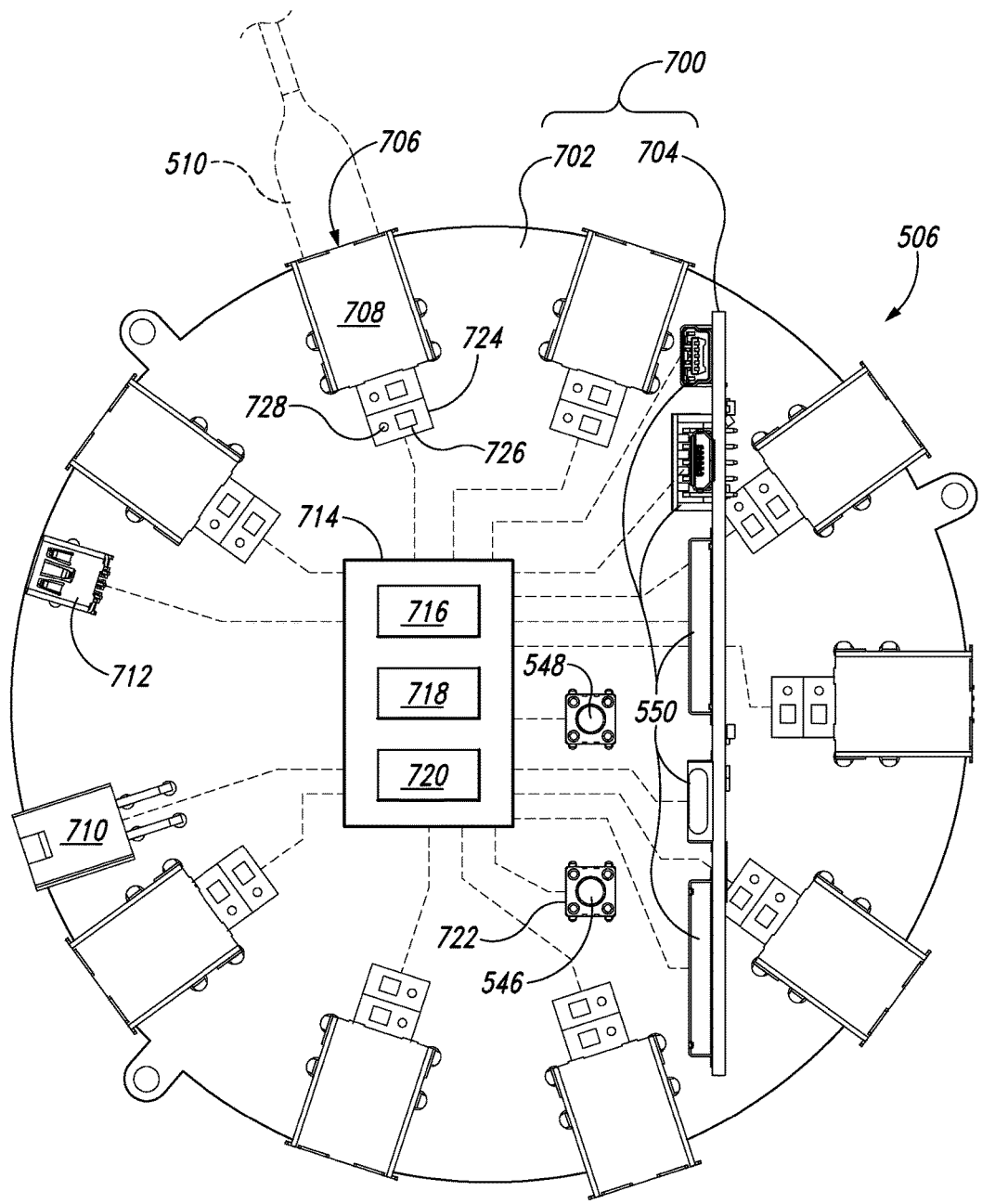
FIG. 7 is a front view of the hub shown in FIG. 5 with the cover omitted.

FIG. 7 is a front view of the hub 506 with the cover 507 omitted for clarity. As shown in FIG. 7, the hub 506 can include a support structure 700 having a motherboard 702 and a daughterboard 704 detachably connected to one another. The hub 506 can further include a plurality of downstream-facing ports 706 (one identified in FIG. 7) carried by the support structure 700 and arranged in stacks 708 (one identified in FIG. 7) of two that are distributed around a circular periphery of the motherboard 702. With reference to FIGS. 5 and 7 together, the upstream-facing connectors 510 can be detachably coupled to corresponding downstream-facing ports 706. The hub 506 can further include a power port 710 and a host-connection port 712 operably connected to the first power line 542 and the first communication line 539, respectively. Like the downstream-facing ports 706, the power port 710 and the host-connection port 712 can be located, for example, at the periphery of the motherboard 702. The support structure 700 can carry the test ports 550 on the daughterboard 704 or at another suitable location. In at least some embodiments, the test ports 550 are parallel to one another and perpendicular to the downstream-facing ports 706. Furthermore, in these and other embodiments, the daughterboard 704 can be replaceable to change a lineup of port types without necessitating replacement of the entire hub 506.

The cable system 500 can further include a controller 714 having memory 716, processing circuitry 718, and testing circuitry 720. The downstream-facing ports 706, the first actuation mechanism 546, the second actuation mechanism 548, and the test ports 550 can be operably connected to the controller 714. In the illustrated embodiment, the support structure 700 carries the controller 714. In other embodiments, the controller 714 can have another suitable location within the cable system 500. For example, in a particular embodiment, the controller 714 can be part of the host computer 503. With reference again to FIG. 7, the cable system 500 can further include a cable-status indicator 722 operably connected to the controller 714. In the illustrated embodiment, the cable-status indicator 722 includes a light-emitting diode (LED; not shown) underlying the first actuation mechanism 546. The first actuation mechanism 546 can be at least partially translucent such that light from the light-emitting diode changes the appearance of the first actuation mechanism 546 at an outer surface of the cover 507 in response to operation of the cable-status indicator 722. In other embodiments, the cable-status indicator 722 can have another suitable form.

The controller 714 can include one or more integrated-circuit devices (not shown) that at least partially form the processing circuitry 718 and/or the testing circuitry 720. For example, the controller 714 can include separate integrated-circuit devices that respectively serve as hub controllers for separate subsets of the downstream-facing ports 706. In a particular embodiment, the controller 714 includes one or more peripheral interface controllers (e.g., part number PIC18F87K22 from Microchip Technology, Inc. of Chandler, Arizona), which can send test results and measurements to the host computer 503 in the form of RS 449 serial data signals. Furthermore, the controller 714 can be configured to download data (e.g., new testing subroutines and updates to active testing subroutines) from the host computer 503. The controller 714 can include one or more switches, translator-circuitry units, port-circuitry units, buses, and other suitable electronic components. In at least some cases, the controller 714 includes a data switch (e.g., part number USB3740 from Microchip Technology, Inc. of Chandler, Arizona) that changes whether data from the downstream-facing ports 706 are relayed to the host computer 503 or relayed to the testing circuitry 720. The first actuation mechanism 546 can be operably connected to the data switch, for example, such that operating the first actuation mechanism 546 causes the data switch to initiate testing of one of the cable components 242.

The hub 506 can include overcurrent-protection elements 724 (one identified in FIG. 7) operably connected between the downstream-facing ports 706 and the controller 714. The overcurrent-protection elements 724 can include automatically resettable fuses 726 (one identified in FIG. 7) and overcurrent indicators 728 (one identified in FIG. 7). The overcurrent-protection elements 724 can be configured to respond to overcurrent in the corresponding cable components 242 detachably coupled to the downstream-facing ports 706. For example, when overcurrent in a given one of the cable components 242 is detected, a corresponding one of the overcurrent-protection elements 724 can deactivate a corresponding one of the downstream-facing ports 706 and illuminate or otherwise change operation of a corresponding one of the overcurrent indicators 728. This can visually alert the overcurrent state of the corresponding cable component 242 to an authorized person during servicing of the cable system 500. Furthermore, the corresponding overcurrent-protection element 724 can indicate the overcurrent state of the cable component 242 to the host computer 503 (FIG. 5), such as via the controller 714. From the host computer 503, information regarding overcurrent states of one or more of the cable components 242 can be used automatically or otherwise to initiate service calls, part orders, or for other suitable purposes.

In the illustrated embodiment, after an overcurrent state triggers one of the overcurrent-protection elements 724, the overcurrent-protection element 724 queries the corresponding downstream-facing port 706 to determine whether an overcurrent state is still present in the cable component 242 coupled to the downstream-facing port 706. When the overcurrent state is no longer present (e.g., after the cable component 242 has been replaced), the automatically resettable fuse 726 can be reset automatically to reinitiate operation of the downstream-facing port 706. In other embodiments, the overcurrent-protection elements 724 can include manually-resettable fuses or have other suitable characteristics.

Figure 8:
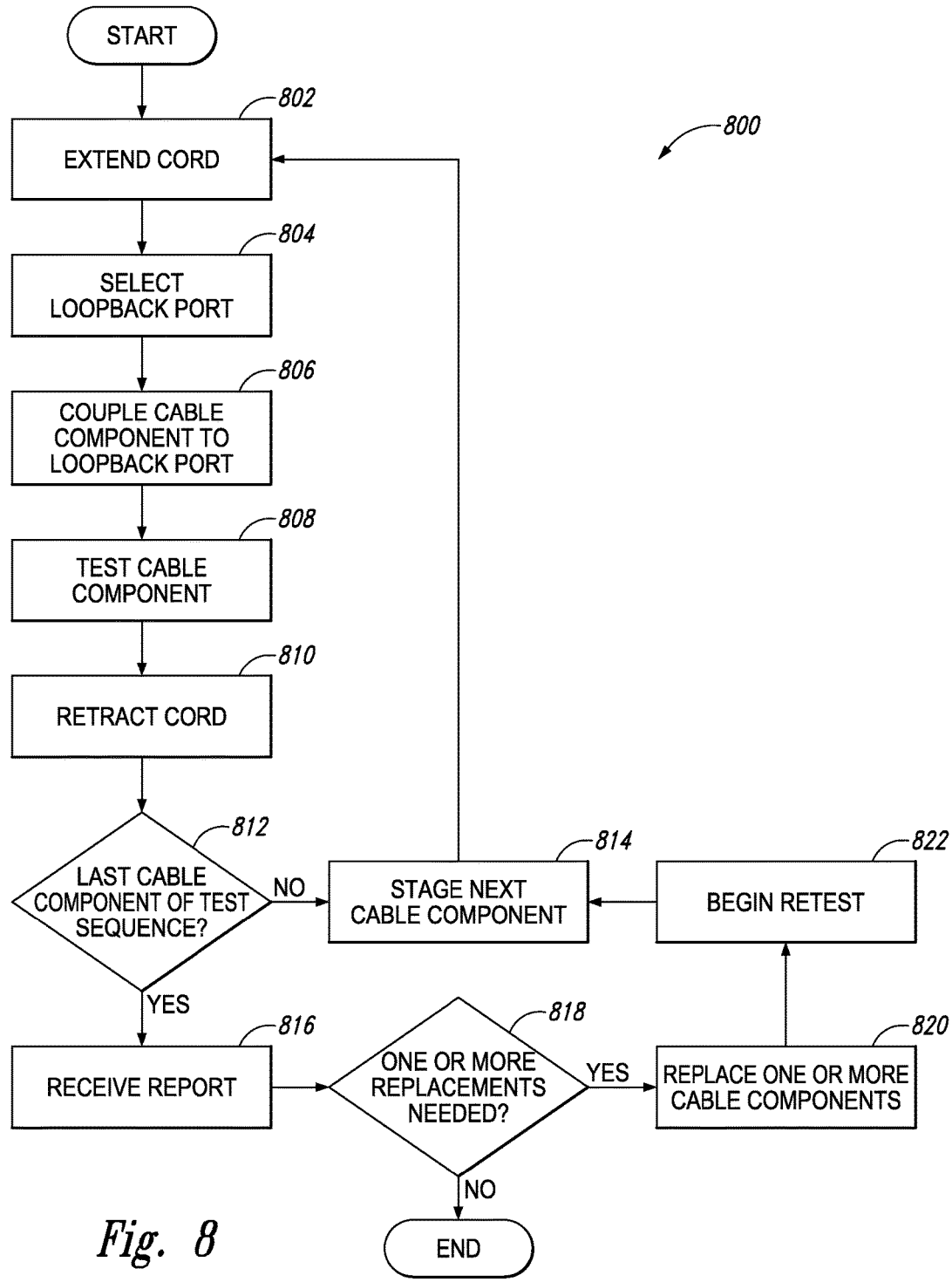
FIG. 8 is a flow diagram of a maintenance routine that can be used with the cable components shown in FIG. 5 in accordance with an embodiment of the present technology.
Figure 9:
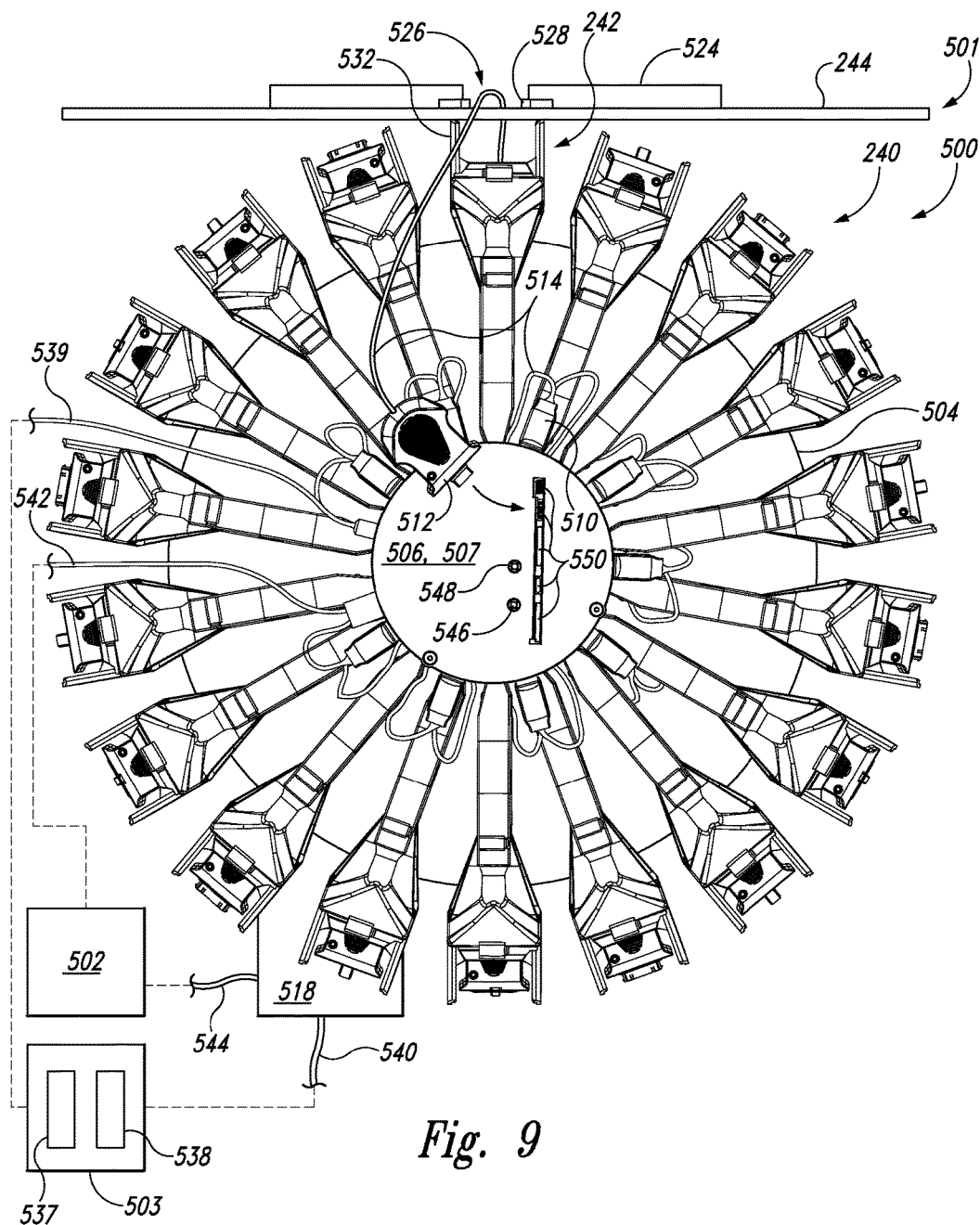
FIG. 9 is a front view of the cable system, the staging apparatus, the power source, and the host computer shown in FIG. 5 at a point during execution of the maintenance routine shown in FIG. 8.

FIG. 8 is a flow diagram of a maintenance routine 800 that can be used with the cable components 242 in accordance with an embodiment of the present technology. FIG. 9 is a front view of the cable system 500, the staging apparatus 501, the power source 502, and the host computer 503 at a point during execution of the routine 800. With reference to FIGS. 8 and 9 together, the routine 800 can include extending (e.g., manually extending by a user) one of the cords 514 corresponding to one of the cable components 242 when the cable component 242 is staged for testing (block 802). This can include rotating or otherwise moving the cable components 242 to position one of the downstream-facing connectors 512 corresponding to the subject cable component 242 adjacent to the opening 600. As shown in FIG. 9, the downstream-facing connector 512 can then be pulled out of the corresponding cradle 532, through the opening 600, and toward the hub 506. The routine 800 can further include selecting one of the test ports 550 for connection to the withdrawn downstream-facing connector 512 (block 804). In at least some cases, the test ports 550 include only one each of several different types of ports. Therefore, selecting one of the test ports 550 for connection to the withdrawn downstream-facing connector 512 can include selecting the only one of the test ports 550 that is compatible with the withdrawn downstream-facing connector 512. Once one of the test ports 550 has been selected, the routine 800 can include detachably coupling the withdrawn downstream-facing connector 512 to the selected test port 550 (block 806).

Each of the cable components 242 can have a test state and an operational state. For example, when one of the cable components 242 is in the operational state, the corresponding downstream-facing connector 512 can be detached from the hub 506. When the cable component 242 is in in the test state, the downstream-facing connector 512 can be detachably coupled to one of the test ports 550. The routine 800 can further include testing one of the cable components 242 while the corresponding downstream-facing connector 512 is detachably coupled to the selected test port 550 (block 808). In at least some cases, an authorized person can operate the first actuation mechanism 246 to initiate the testing. For example, the memory 716 can store instructions that, when executed by the controller 714 using the processing circuitry 718, cause the testing circuitry 720 to test one of the cable components 242 in response to operation of the first actuation mechanism 546.

The routine 800 can be configured to determine whether the cable components 242 are connected to the correct downstream-facing ports 706. For example, testing one of the cable components 242 can include detachably coupling the cable component 242 to an appropriate one of the test ports 550 and determining whether the cable component 242 is a correct type based on whether a designator for the test port 550 to which the cable component 242 is detachably coupled corresponds to the correct type. The memory 716 can store designators respectively associated with the downstream-facing ports 706. These designators can indicate the type of downstream-facing connector 512 of the cable component 242 that should be coupled to a particular one of the downstream-facing ports 706. Additional designators stored in the memory 716 and respectively associated with the test ports 550 can indicate the respective types of the test ports 550. During testing of one of the cable components 242, if the testing circuitry 720 determines that a designator associated with one of the test ports 550 to which the cable component 242 is detachably coupled does not match a designator associated with one of the downstream-facing ports 706 to which the cable component 242 is detachably coupled, the cable component 242 can be flagged as being an improper type. In addition or alternatively, testing the cable component 242 can include determining whether the cable component 242 is capable of carrying data. Other types of testing are also possible. One example of a testing subroutine that can be used with the routine 800 is described below with reference to FIG. 10.

After testing one of the cable components 242, the cable-status indicator 722 can indicate the status of the cable component 242 based on the test. For example, the memory 716 can store instructions that, when executed by the controller 714 using the processing circuitry 718, cause the cable-status indicator 722 to indicate a status of the cable component 242 based on the test. As one possibility, if the cable component 242 failed the test, the cable-status indicator 722 can illuminate in red whereas, if the cable component 242 passed the test, the cable-status indicator 722 can illuminate in green. An authorized person can use this indication alone or in conjunction with a report for a complete sequence of tests to determine which of the cable components 242 should be replaced.

The routine 800 can further include detaching the downstream-facing connector 512 corresponding to the tested cable component 242 from the selected test port 550 (block 808) and then retracting (e.g., automatically retracting) the corresponding cord 514 (block 810). At block 812, if the tested cable component 242 is not the last of the cable components 242 in a complete test sequence (e.g., a test sequence that includes all of the cable components 242 or a suitable subset of the cable components 242), the routine 800 can proceed to staging the next one of the cable components 242 in the test sequence for testing (block 814). In at least some cases, an authorized person operates the second actuation mechanism 248 to move the cable components 242 to stage the next one of the cable component 242 for testing. For example, the memory 716 can store instructions that, when executed by the controller 714 using the processing circuitry 718, cause the drive mechanism 518 to move the cable components 242 in response to operation of the second actuation mechanism 248.

When the next one of the cable components 242 is staged for testing, the routine 800 can include repeating the operations of blocks 802-812. In this way, the routine 800 can include serially testing any suitable number of cable components 242 in a test sequence. When the last of the cable components 242 in the test sequence has been tested, the routine 800 can include receiving a report on the respective statuses of the tested cable components 242 in the test sequence (block 816). At block 818, if replacement of one or more of the cable components 242 is needed, the routine 800 can include replacing the one or more of the cable components 242 based on the report (block 820). Thereafter, the routine 800 can include retesting the cable components 242 in the test sequence (block 822).

In at least some cases, a user of the kiosk 100 (FIG. 1) or another machine that includes the cable system 500 can use the routine 800 or a portion thereof to test one or more of the cable components 242 in addition to or instead of such testing being performed by a service technician. For example, a machine may allow use the routine 800 or a portion thereof to confirm whether one of the cable components 242 is the root cause of a failed electrical test on a mobile device that a user presents to the machine for possible sale. To facilitate this type of testing or for another reason, the test ports 550 can be accessible to a user of a machine who is not authorized to service the machine. In a particular example, a machine automatically opens a panel or other suitable structure to reveal the test ports 550 to a user. In addition or alternatively, the machine can be configured to prompt the user to connect one of the cable components 242 to one of the test ports 550 at a suitable time during use the machine to process a mobile device for possible sale.

Figure 10:
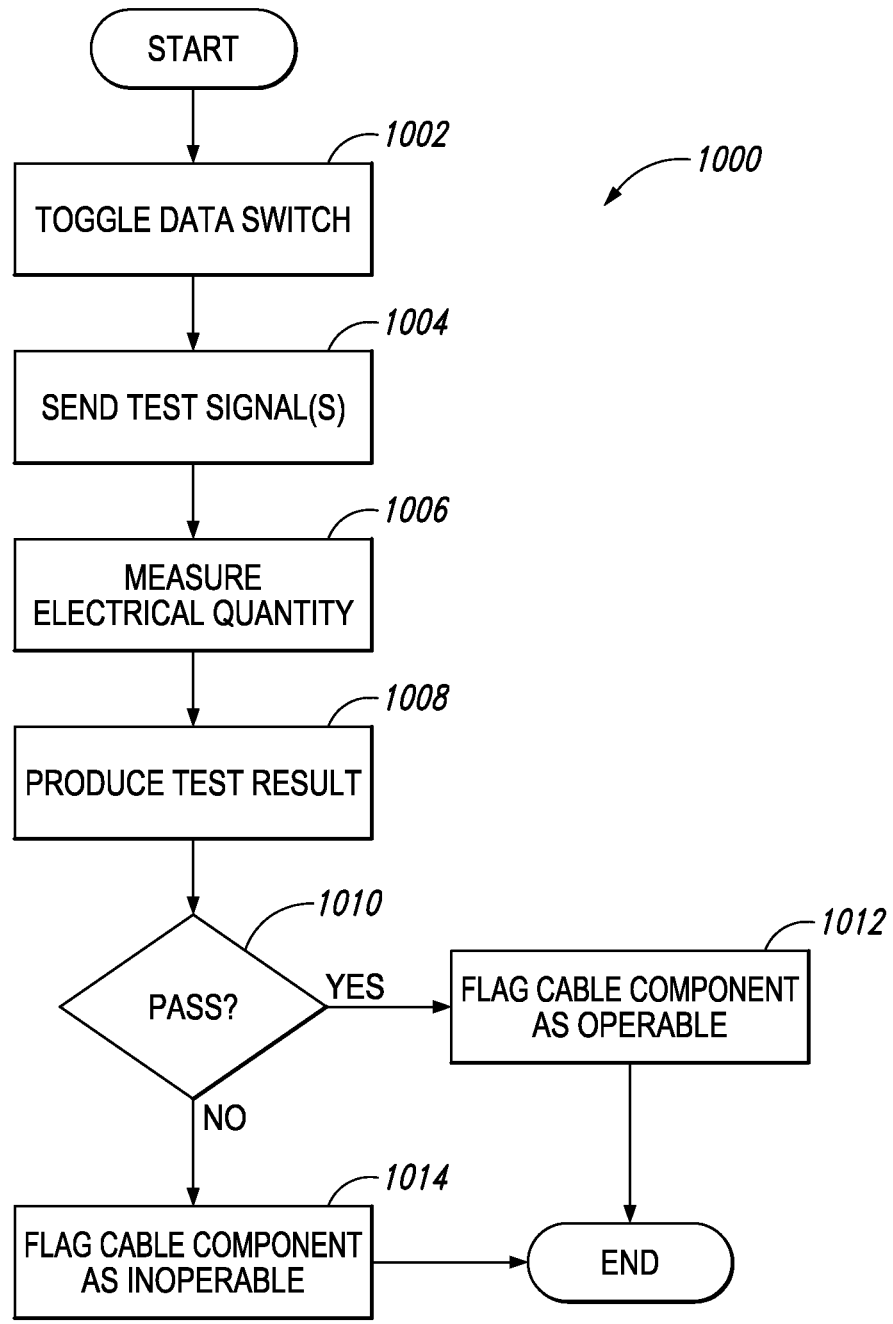
FIG. 10 is a flow diagram of a testing and flagging subroutine 1000 that can be used with the maintenance routine shown in FIG. 8 in accordance with an embodiment of the present technology.

FIG. 10 is a flow diagram of a testing and flagging subroutine 1000 that can be used with the routine 800 in accordance with an embodiment of the present technology. The subroutine 1000 can include toggling a switch (block 1002) of the controller 714 to route data from the downstream-facing ports 706 to the testing circuitry 720. The subroutine 1000 can further include sending one or more test signals to a given one of the cable components 242 (block 1004) and measuring an electrical quantity (block 1006) that results from sending the one or more test signals. The one or more test signals can include, for example, a voltage signal, a differential signal (e.g., applied across a pair of data lines), a data packet, a current signal, or an AC signal, among other possibilities. The measured electrical quantity can include, for example, signal interference, time of flight, resistance, or capacitance, among other possibilities. In at least some embodiments, the controller 714 produces the one or more test signals and processes the electrical quantity. Accordingly, the controller 714 can function as both a host and as a client.

Based on the measured electrical quantity, the subroutine 1000 can include producing a test result (block 1008). The test result can include, for example, a pass/fail indication. In some cases, the test result identifies a failure type, such as whether a tested cable component 242 has a high impedance, is opened circuited, or failed the testing for another reason. In other cases, the pass/fail indication can be binary. At block 1010, if the test result indicates that the tested cable component 242 failed the test, the subroutine 1000 can include flagging the tested cable component 242 as inoperable (block 1012), such as in the memory 716. Similarly, if the test result indicates that the tested cable component 242 passed the test, the subroutine 1000 can include flagging the tested cable component 242 as operable (block 1014), such as in the memory 716. As discussed above, an authorized person can use a report indicating which of the cable components 242 is flagged as inoperable to determine which of the cable components 242 to replace. In addition or alternatively, an authorized person may receive an indication of overcurrent in one or more of the cable components 242 from the overcurrent indicators 728. The authorized person may then replace the indicated one or more of the cable components 242. This can automatically reset the fuses 726 corresponding to the downstream-facing ports 706 to which the replaced cable components 242 are connected.

Those of ordinary skill in the art will appreciate that the routine 800, the subroutine 1000 and other suitable functions and methods described herein can be implemented as an application specific integrated circuit (ASIC), by a digital signal processing (DSP) integrated circuit, through conventional programmed logic arrays and/or circuit elements of the controller 714 and/or the host computer 503. While many of the embodiments are shown and described as being implemented in hardware (e.g., one or more integrated circuits designed specifically for a task), such embodiments could equally be implemented in software and be performed by one or more processors. Such software can be stored on any suitable computer-readable medium, such as microcode stored in a semiconductor chip, on a computer-readable disk, or downloaded from a server and stored locally at a client.

In various embodiments, all or a portion of the routine 800, the subroutine 1000, and other suitable functions and methods described herein can be implemented by means of a consumer operating one or more of the devices and systems described above. For example, the kiosk 100 can perform the processes or blocks of the routine 800 and/or the subroutine 1000. In some embodiments of the present technology, portions (e.g., blocks) of a routine can be performed by a plurality of the kiosks 100a-100n of FIG. 1, and/or by one or more remote computers. For example, such remote computers can include one or more of the server computers 404 of FIG. 4 and/or computing resources associated with the cloud 426, the resale marketplace 430, and/or the kiosk operator 432 operating separately or in combination. The kiosk 100 and/or the remote computers can perform the routines described herein using one or more local and/or remote databases (e.g., the database 406 of FIG. 4, such as the GSMA IMEI Database). Accordingly, the description of the routine 800, the subroutine 1000 and the other suitable functions and methods disclosed herein may refer interchangeably to the routine performing an operation and/or the kiosk performing the operation, with the understanding that any of the above devices, systems, and resources can perform all or part of the operation.

The present technology includes various other types and embodiments of recycling machines. For example, the present technology includes embodiments such as a countertop recycling station and/or a retail store-based interface operated by or with the assistance of a retail employee. As another example, the present technology includes embodiments such as a recycling machine configured to accept all kinds of devices, including larger items (e.g., desktop and laptop computers, televisions, gaming consoles, DVRs, etc.).

The above Detailed Description of examples and embodiments of the invention is not intended to be exhaustive or to limit the invention to the precise form disclosed above. Although specific examples for the invention are described above for illustrative purposes, various equivalent modifications are possible within the scope of the invention, as those skilled in the relevant art will recognize.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further any specific numbers noted herein are only examples: alternative implementations may employ differing values or ranges.

Although the above description describes various embodiments of the invention and the best mode contemplated, regardless how detailed the above text, the invention can be practiced in many ways. Details of the system may vary considerably in its specific implementation, while still being encompassed by the present technology. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

We claim:

1. A cable system, comprising:
   a controller including memory, processing circuitry, and testing circuitry, the memory storing instructions;
   a plurality of downstream-facing ports operably connected to the controller;
   a cable-status indicator operably connected to the controller; and
   a plurality of overcurrent-protection elements, where each of the overcurrent-protection elements is operably connected to one of the downstream-facing ports,
   wherein the instructions, when executed by the controller using the processing circuitry, cause—
      the testing circuitry to test a cable component having a first end portion detachably coupled to one of the downstream-facing ports, and
      the cable-status indicator to indicate a status of the cable component based on the test.

2. The cable system of claim 1, further comprising a plurality of test ports operably connected to the controller.

3. The cable system of claim 2, wherein the plurality of test ports includes:
   a first test port having electrical contacts arranged in a first configuration; and
   a second test port having electrical contacts arranged in a second configuration different than the first configuration.

4. A cable system, comprising:
   a controller including memory, processing circuitry, and testing circuitry, the memory storing instructions;
   a plurality of downstream-facing ports operably connected to the controller;
   a plurality of test ports operably connected to the controller, wherein the plurality of test ports includes:
      a first test port having electrical contacts arranged in a first configuration; and
      a second test port having electrical contacts arranged in a second configuration different than the first configuration; and
   a cable-status indicator operably connected to the controller,
   wherein the instructions, when executed by the controller using the processing circuitry, cause—
      the testing circuitry to test a cable component having a first end portion detachably coupled to one of the downstream-facing ports and a second end portion detachably coupled to one of the test ports, and
      the cable-status indicator to indicate a status of the cable component based on the test.

5. The cable system of claim 4 wherein the plurality of test ports includes a third test port having electrical contacts arranged in a third configuration different than the first and second configurations.

6. The cable system of claim 2 wherein:
   the plurality of test ports is configured to be simultaneously electrically connected to the plurality of downstream-facing ports via a first electrical connection and via a separate second electrical connection while the testing circuitry tests the cable component;
   the first electrical connection includes the testing circuitry; and
   the second electrical connection includes the cable component.

7. The cable system of claim 1 wherein the individual overcurrent-protection elements include automatically resettable fuses.

8. The cable system of claim 1, further comprising an actuation mechanism operably connected to the controller, wherein the instructions, when executed by the controller using the processing circuitry, cause the testing circuitry to test the cable component in response to operation of the actuation mechanism.

9. The cable system of claim 1, further comprising a hub including a support structure, wherein the support structure carries the plurality of downstream-facing ports.

10. The cable system of claim 9 wherein the individual downstream-facing ports are parallel to one another in a first plane.

11. The cable system of claim 9 wherein the individual downstream-facing ports are circumferentially distributed around a periphery of the support structure.

12. A cable system, comprising;
a controller including memory, processing circuitry, and testing circuitry, the memory storing instructions:
a plurality of downstream-facing ports operably connected to the controller;
a plurality of test ports operably connected to the controller;
a cable-status indicator operably connected to the controller; and
an actuation mechanism operably connected to the controller,
wherein the instructions, when executed by the controller using the processing circuitry, cause—
the testing circuitry to test a cable component having a first end portion detachably coupled to one of the downstream-facing ports and a second end portion detachably coupled to one of the ports,
the cable-status indicator to indicate a status of the cable component based on the test; and
the testing circuitry to test the cable component in response to operation of the actuation mechanism.

13. A cable system, comprising:
a hub including—
a support structure,
a first downstream-facing port carried by the support structure, and
a second downstream-facing port carried by the support structure;
a first test port operably associated with the hub, the first test port having electrical contacts arranged in a first configuration;
a second test port operably associated with the hub, the second test port having electrical contacts arranged in a second configuration different than the first configuration;
a first cable component detachably coupled to the hub, the first cable component including—
a first upstream-facing connector detachably coupled to the first downstream-facing port,
a first flexible cord having a proximal end portion downstream from the first upstream-facing connector and a distal end portion downstream from its proximal end portion, and
a first downstream-facing connector at the distal end portion of the first cord; and
a second cable component detachably coupled to the hub, the second cable component including—
a second upstream-facing connector detachably coupled to the second downstream-facing port,
a second flexible cord having a proximal end portion downstream from the second upstream-facing connector and a distal end portion downstream from its proximal end portion, and
a second downstream-facing connector at the distal end portion of the second cord, wherein—
the first cable component has—
an operational state in which the first downstream-facing connector is detached from the hub, and
a test state in which the first downstream-facing connector is detachably coupled to the first test port, and
the second cable component has—
an operational state in which the second downstream-facing connector is detached from the hub, and
a test state in which the second downstream-facing connector is detachably coupled to the second test port.

14. The cable system of claim 13 wherein:
the first test port is a mini USB port; and
the second test port is a micro USB port.

15. The cable system of claim 13 wherein:
the hub includes a third downstream-facing port carried by the support structure;
the cable system further comprises a third cable component detachably coupled to the hub, the third cable component including—
a third upstream-facing connector detachably coupled to the third downstream-facing port,
a flexible third cord having a proximal end portion downstream from the third upstream-facing connector and a distal end portion downstream from its proximal end portion, and
a third downstream-facing connector at the distal end portion of the third cord; and
the third cable component has—
an operational state in which the third downstream-facing connector is detached from the hub, and
a test state in which the third downstream-facing connector is detachably coupled to either the first test port or the second test port.

16. The cable system of claim 13 wherein the first and second cables are rotatably mounted to a machine for processing electronic devices.

17. The cable system of claim 13 wherein the hub includes:
a first overcurrent-protection element operably connected to the first downstream-facing port such that the first overcurrent-protection element responds to overcurrent in the first cable component; and
a second overcurrent-protection element operably connected to the second downstream-facing port such that the second overcurrent-protection element responds to overcurrent in the second cable component.

18. The cable system of claim 17 wherein:
the first overcurrent-protection element includes an automatically resettable first fuse; and
the second overcurrent-protection element includes an automatically resettable second fuse.

19. The cable system of claim 13, further comprising:
a drive mechanism operably connected to the first and second cable components, wherein the drive mechanism is configured to move the first and second cable components and thereby cause a given one of the first and second cable components to be staged for testing while the other one of the first and second cable components is not staged for testing; and
a controller including memory, processing circuitry, and testing circuitry, the memory storing instructions that, when executed by the controller using the processing circuitry, cause the testing circuitry to test the given one of the first and second cable components while the given one of the first and second cable components is in its test state.

20. The cable system of claim 19 wherein the drive mechanism is configured to rotate the first and second cable components and thereby cause the given one of the first and second cable components to be staged for testing while the other one of the first and second cable components is not staged for testing.

21. The cable system of claim 19, further comprising an actuation mechanism operably connected to the controller, wherein the instructions, when executed by the controller using the processing circuitry, cause the testing circuitry to test the given one of the first and second cable components in response to operation of the actuation mechanism.

22. The cable system of claim 21 wherein:
the actuation mechanism is a first actuation mechanism;
the cable system includes a second actuation mechanism; and
the instructions, when executed by the controller using the processing circuitry, cause the drive mechanism to move the first and second cable components in response to operation of the second actuation mechanism.

23. A cable system comprising:
a controller including memory, processing circuitry, and testing circuitry, the memory storing instruction;
a plurality of downstream-facing ports operably connected to the controller;
a plurality of test ports operably connected to the controller,
a hub including a support structure, wherein the support structure carries the plurality of downstream-facing ports; and
a cable-status indicator operably connected to the controller,
wherein the instruction, when executed by the controller using the processing circuitry, cause—
the testing circuitry to test a cable component having a first end portion detachably coupled to one of the downstream-facing ports and a second end portion detachably coupled to one of the test ports, and
the cable-status indicator to indicate a status of the cable component based on the test.

24. The cable system of claim 23 wherein the support structure carries the plurality of test ports.

25. The cable system of claim 24 wherein:
the individual downstream-facing ports are parallel to one another in a first plane; and
the individual test ports are parallel to one another in a second plane perpendicular to the first plane.

26. The cable system of claim 24 wherein:
the support structure includes a motherboard and a daughterboard;
the support structure carries the plurality of downstream-facing ports at the motherboard; and
the support structure carries the plurality of test ports at the daughterboard.

27. The cable system of claim 26 wherein the daughterboard is detachable from the motherboard and replaceable to change a lineup of port types among the test ports without necessitating replacement of the motherboard.

28. The cable system of claim 23 wherein the individual downstream-facing ports are circumferentially distributed around a periphery of the support structure.

29. The cable system of claim 4 wherein:
the first test port is a mini USB port; and
the second test port is a micro USB port.

* * * * *

UNITED STATES PATENT AND TRADEMARK OFFICE
CERTIFICATE OF CORRECTION

| | | |
|---|---|---|
| PATENT NO. | : 10,401,411 B2 | Page 1 of 1 |
| APPLICATION NO. | : 14/500739 | |
| DATED | : September 3, 2019 | |
| INVENTOR(S) | : James Andrew Snook et al. | |

It is certified that error appears in the above-identified patent and that said Letters Patent is hereby corrected as shown below:

On the Title Page

On the page 4, in Column 2, under "Other Publications", Line 19, delete "-revievv-" and insert -- -review- --, therefor.

On the page 4, in Column 2, under "Other Publications", Line 27, delete "PaNnel" and insert -- Panel --, therefor.

On the page 5, in Column 2, under "Other Publications", Line 35, delete "14/508,449," and insert -- 14/506,449, --, therefor.

In the Claims

In Column 24, Line 5, in Claim 1, delete "where" and insert -- wherein --, therefor.

In Column 25, Line 13, in Claim 12, delete "comprising;" and insert -- comprising: --, therefor.

In Column 25, Line 15, in Claim 12, delete "instructions:" and insert -- instructions; --, therefor.

In Column 25, Line 29, in Claim 12, after "the" insert -- test --.

In Column 27, Line 26, in Claim 23, delete "system" and insert -- system, --, therefor.

In Column 27, Line 28, in Claim 23, delete "instruction;" and insert -- instructions; --, therefor.

In Column 27, Line 35, in Claim 23, delete "ports:" and insert -- ports; --, therefor.

In Column 28, Line 3, in Claim 23, delete "instruction," and insert -- instructions, --, therefor.

Signed and Sealed this
Nineteenth Day of May, 2020

Andrei Iancu
*Director of the United States Patent and Trademark Office*